(12) United States Patent
Takaishi

(10) Patent No.: US 8,890,241 B2
(45) Date of Patent: Nov. 18, 2014

(54) SEMICONDUCTOR DEVICE

(71) Applicant: Elpida Memory, Inc, Tokyo (JP)

(72) Inventor: Yoshihiro Takaishi, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 12 days.

(21) Appl. No.: 13/887,733

(22) Filed: May 6, 2013

(65) Prior Publication Data

US 2013/0307056 A1    Nov. 21, 2013

(30) Foreign Application Priority Data

May 15, 2012    (JP) .................................. 2012-111457

(51) Int. Cl.
*H01L 29/76* (2006.01)
(52) U.S. Cl.
USPC ........... 257/331; 257/329; 257/330; 257/347; 257/401; 438/283
(58) Field of Classification Search
CPC .................. H01L 27/10823; H01L 27/10879; H01L 21/822821; H01L 29/66795; H01L 29/785; H01L 29/7802
USPC ................. 257/329, 330, 331, 343, 347, 401; 438/142, 157, 197, 283
See application file for complete search history.

(56) References Cited

U.S. PATENT DOCUMENTS

| | | | |
|---|---|---|---|
| 8,455,945 B2 * | 6/2013 | Lee et al. ....................... | 257/331 |
| 8,486,788 B2 * | 7/2013 | Iwanaga et al. ............... | 438/283 |
| 8,759,904 B2 * | 6/2014 | Wahl et al. .................... | 257/328 |

FOREIGN PATENT DOCUMENTS

JP    2009-081377    4/2009

* cited by examiner

*Primary Examiner* — Dung A. Le
(74) *Attorney, Agent, or Firm* — Young & Thompson

(57) ABSTRACT

Disclosed is a semiconductor device comprising a semiconductor substrate including first, second and third surfaces, the second surface being placed above the first surface, the third surface having first and second edges connecting to the first and second surfaces, respectively; an isolation region including an insulator and formed on the first and third surfaces; an active region including the second surface and fenced with the insulator of the isolation region; and first and second semiconductor pillars each protruding upwardly from the second surface in the active region, wherein the first semiconductor pillar is thinner than the second semiconductor pillar.

20 Claims, 37 Drawing Sheets

SEMICONDUCTOR DEVICE

BACKGROUND OF THE INVENTION

1. Field of the Invention

The present invention relates to a semiconductor device, and more particularly to a semiconductor device having at least two types of pillar-shaped insulated gate field effect transistors with different threshold characteristics on the same substrate.

2. Description of the Related Art

The pillar-shaped insulated gate field effect transistor (hereinafter referred to as pillar-FET) can increase a ratio between on-current and off-current by depleting a channel region and thus is suitable for low-voltage and high-speed operation. In a region with a pillar width of 100 nm or less, a characteristic improving effect due to depletion of the channel region is observed. Further decrease in pillar width leads to a further improvement in the ratio between on-current and off-current to be observed.

In addition, the pillar-FETs require various threshold voltages depending on circuit operation, which is controlled by changing an impurity concentration of the channel region in the same manner as ordinary planer FETs.

Examples of a method of diffusing an impurity into a channel region of a pillar-FET include a procedure disclosed in JP 2009-081377A, where in FIG. 2 to FIG. 12, and in paragraphs [0017] to [0027], a predetermined concentration of boron is diffused in a silicon substrate beforehand and then a silicon pillar is formed. However, the description focuses only on a single channel impurity concentration.

With improvement in the ratio between on-current and off-current caused by decrease in pillar width, a depletion region extends to an entire pillar of the channel region, resulting in reduction of the amount of change in threshold voltage corresponding to reduction of the amount of change in impurity concentration.

When the impurity concentration dependence of the amount of change in threshold voltage becomes too small, excessively high or low impurity concentration is required to obtain a desired threshold voltage. This may cause serious damage such as a reduction in source-to-drain punch-through breakdown voltage and a reduction in PN junction breakdown voltage.

SUMMARY

With an embodiment according to the present invention, there is provided a semiconductor device including:

a semiconductor substrate including first, second and third surfaces, the second surface being placed above the first surface, the third surface having first and second edges connecting to the first and second surfaces, respectively;

an isolation region including an insulator and formed on the first and third surfaces;

an active region including the second surface and fenced with the insulator of the isolation region; and first and second semiconductor pillars each protruding upwardly from the second surface in the active region, wherein the first semiconductor pillar is thinner than the second semiconductor pillar.

With another embodiment according to the present invention, there is provided a semiconductor device including:

a semiconductor substrate including first, second and third surfaces, the second surface being placed above the first surface, the third surface having first and second edges that connects to the first and second surfaces, respectively;

an isolation region including an insulator and formed on the first and third surfaces;

an active region including the second surface and fenced with the insulator of the isolation region;

a plurality of first semiconductor pillars each protruding upwardly from the second surface in the active region;

a plurality of second semiconductor pillars each protruding upwardly from the second surface in the active region, wherein each of the first semiconductor pillar is thinner than each of the second semiconductor pillar.

With still another embodiment according to the present invention, there is provided a semiconductor device including:

a semiconductor substrate including first, second and third surfaces, the second surface being placed above the first surface, the third surface having first and second edges connecting to the first and second surfaces, respectively;

an isolation region including an insulator and formed on the first and third surfaces;

an active region including the second surface and fenced with the insulator of the isolation region; and a first field effect transistor including a plurality of first semiconductor pillars that protrude upwardly from the second surface in the active region; and a second field effect transistor including a plurality of second semiconductor pillars that protrude upwardly from the second surface in the active region;

wherein each of the first semiconductor pillar is thinner than each of the second semiconductor pillar.

According to an exemplary embodiment, the amount of change in threshold voltage corresponding to the impurity concentration of a channel portion can be greatly increased by changing the pillar width, and thus a desired threshold voltage difference can be obtained by a smaller concentration change.

Even with the same channel impurity concentration, the threshold voltage can be changed by changing the pillar width. Thus, pillar-FETs having a different threshold property can be obtained in the same ion-implantation process by adjusting the pillar width.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Exemplary Embodiment 1

Figure 1A:
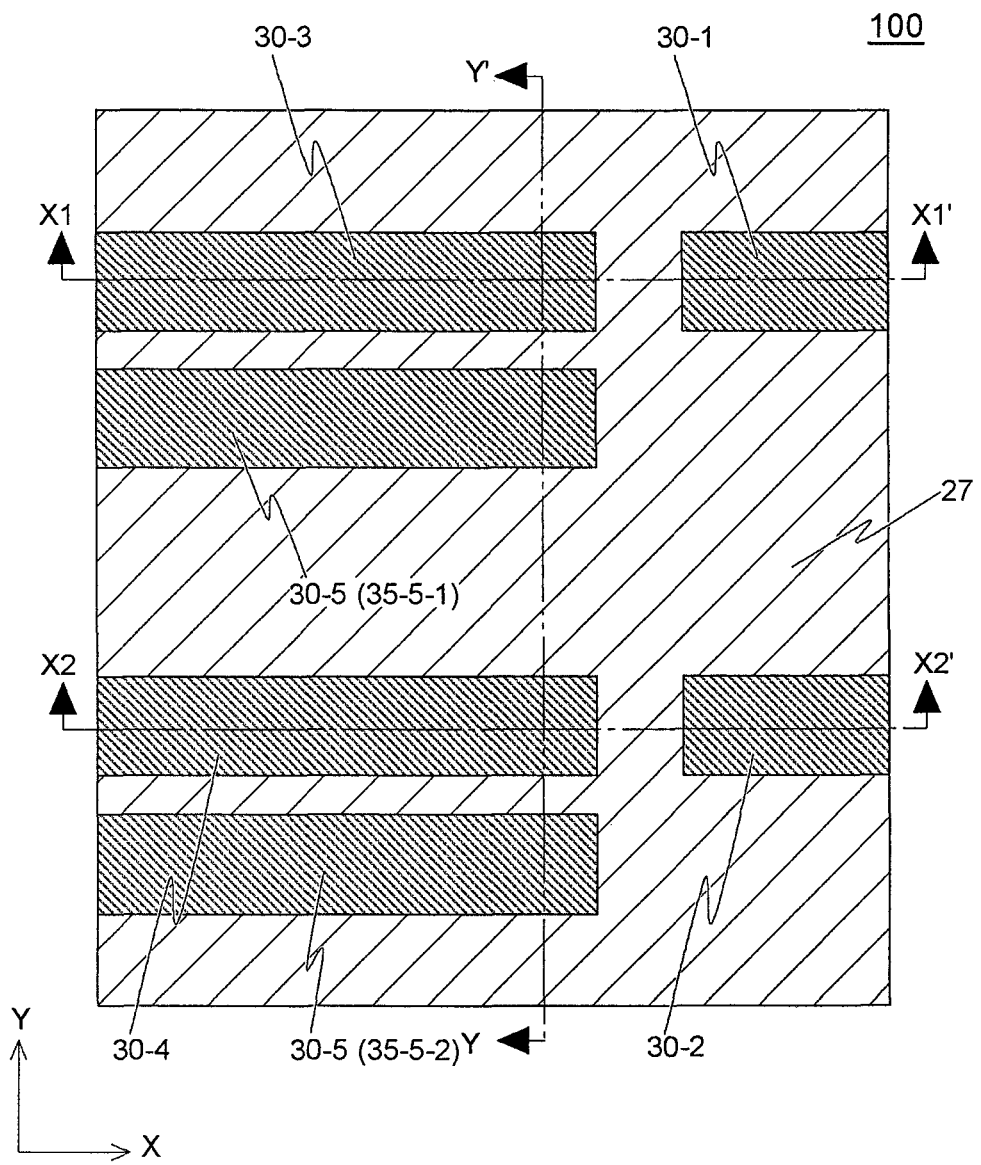
FIG. 1A is a plan view of main components of a semiconductor device according to an exemplary embodiment, FIGS. 1B to 1D being a cross-sectional view along line X1-X1', a cross-sectional view along line X2-X2', and a cross-sectional view along line Y-Y respectively in FIG. 1A.
Figure 1B:
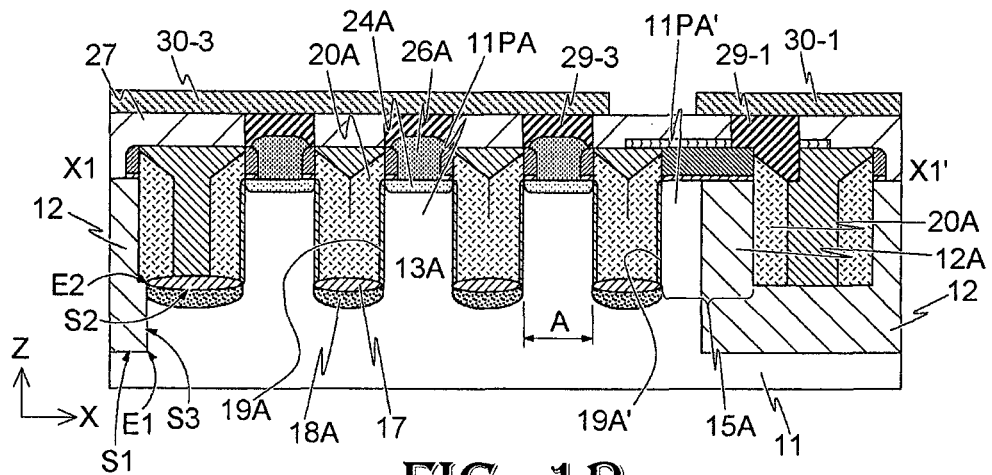
Figure 1C:
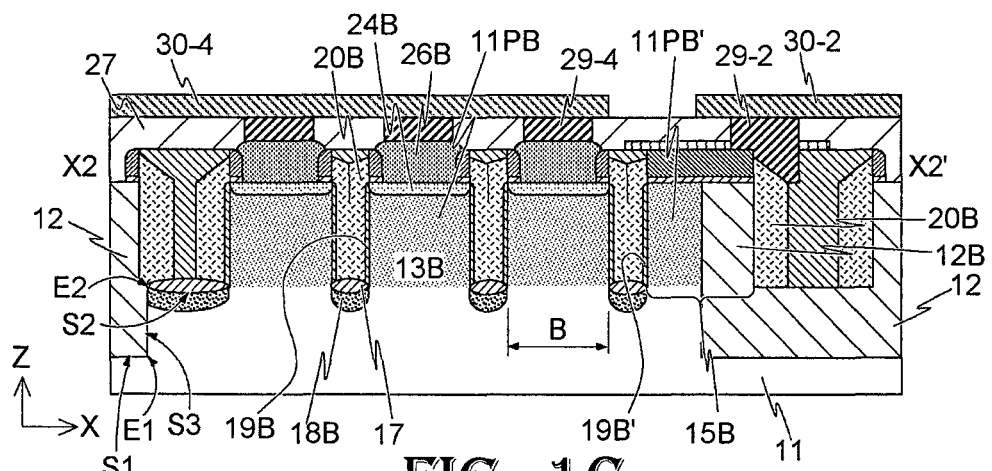
Figure 1D:
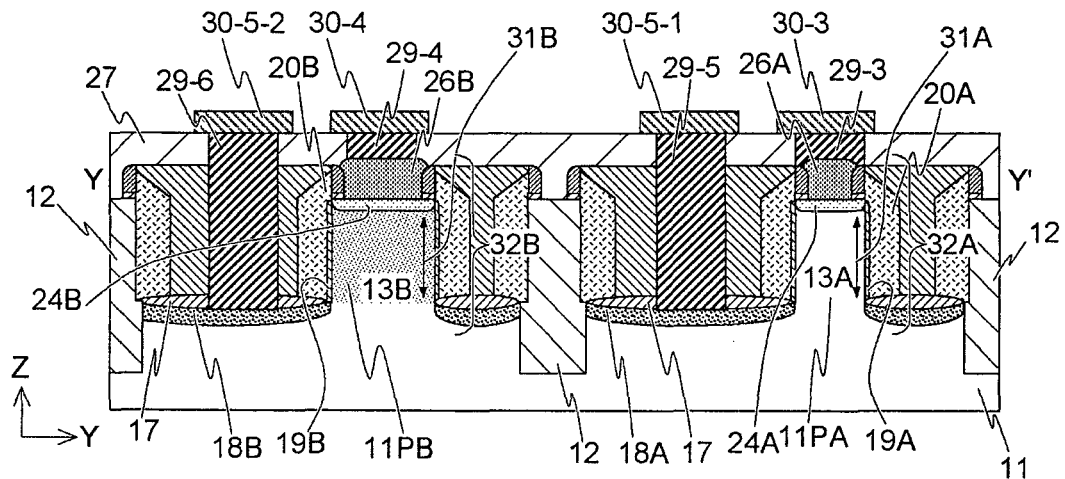
Figure 2:
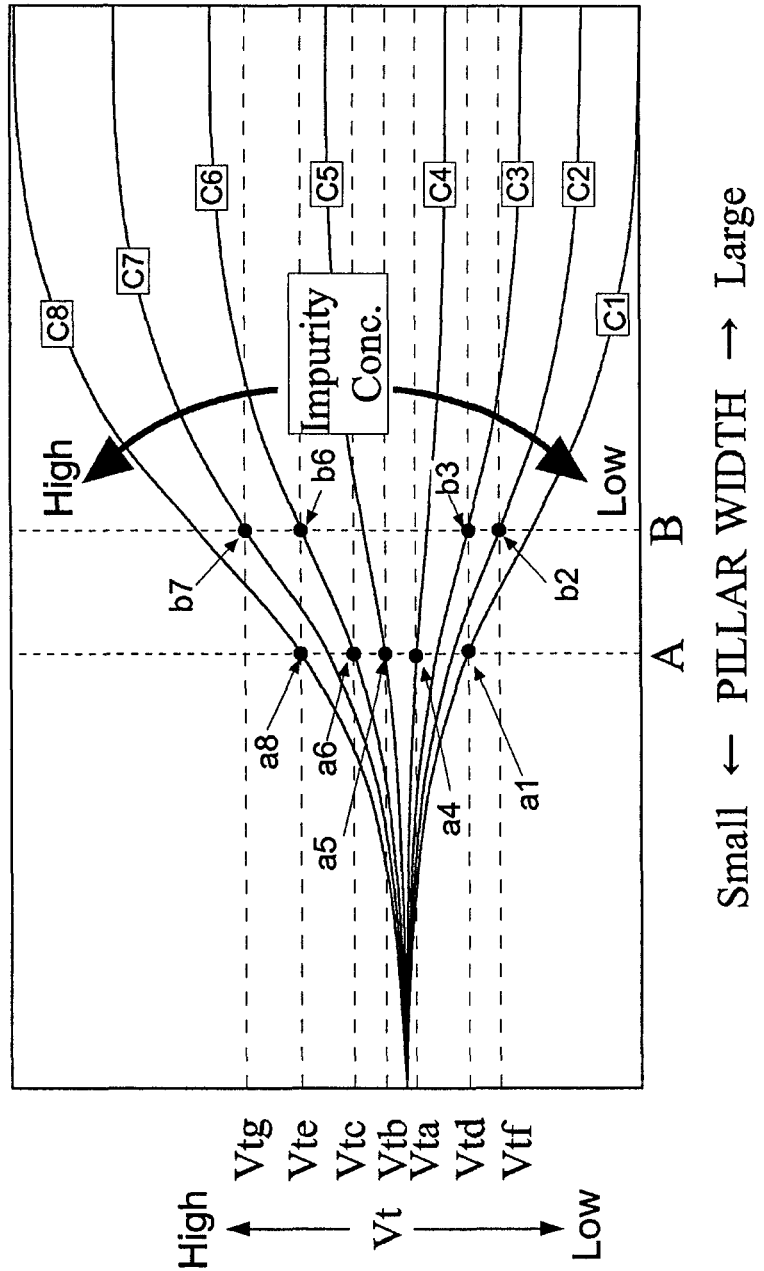
FIG. 2 is a graph illustrating a relation between a pillar width and a threshold voltage for each impurity concentration (C1 to C8)
Figure 3A:
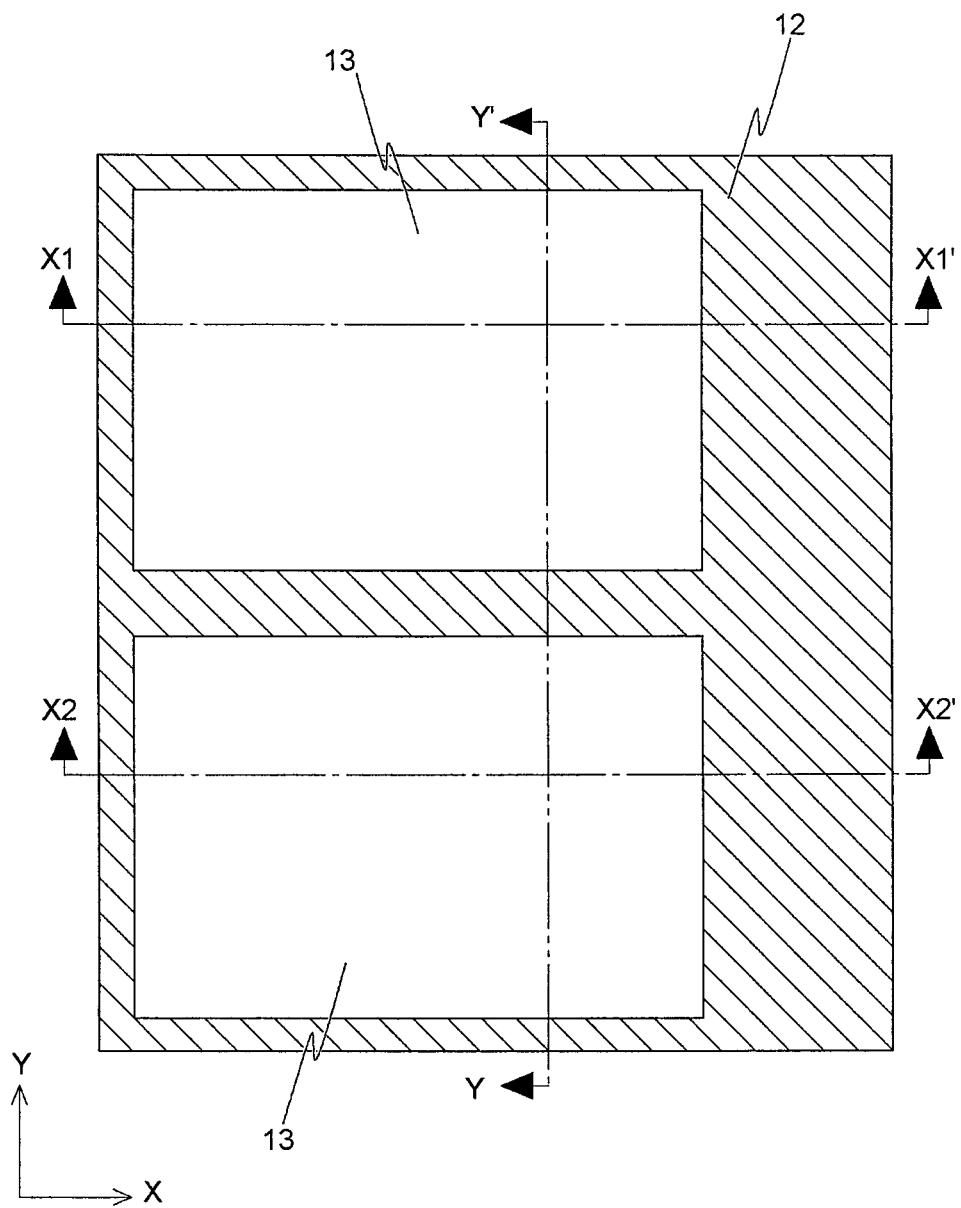
FIG. 3A is a plan view illustrating a manufacturing process of the semiconductor device according to the exemplary embodiment, FIGS. 3B to 3D being a cross-sectional view along line X1-X1', a cross-sectional view along line X2-X2', and a cross-sectional view along line Y-Y respectively in FIG. 3A.
Figure 3B:
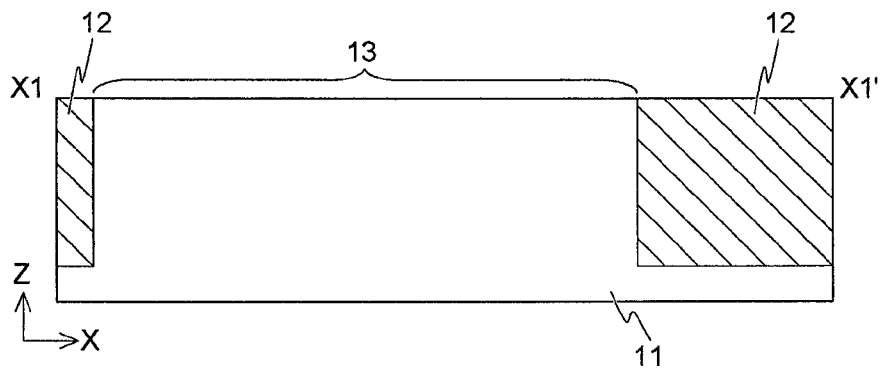
Figure 3C:
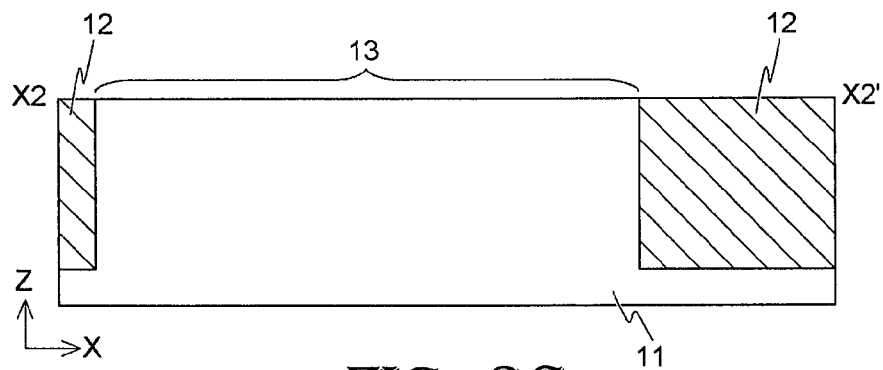
Figure 3D:
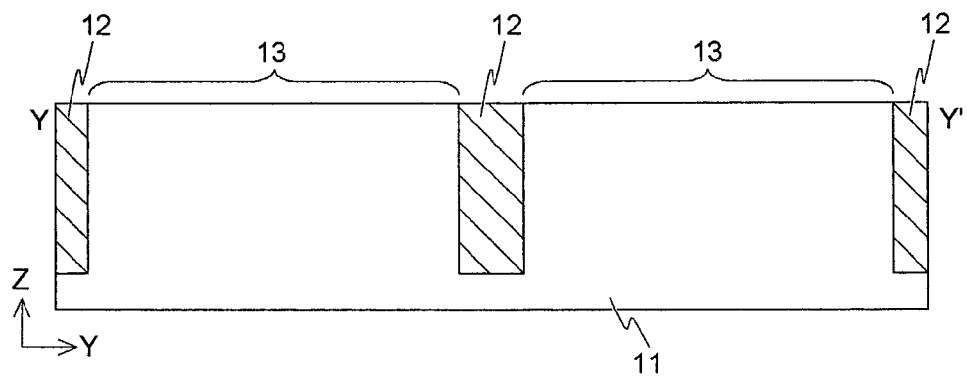
Figure 4A:
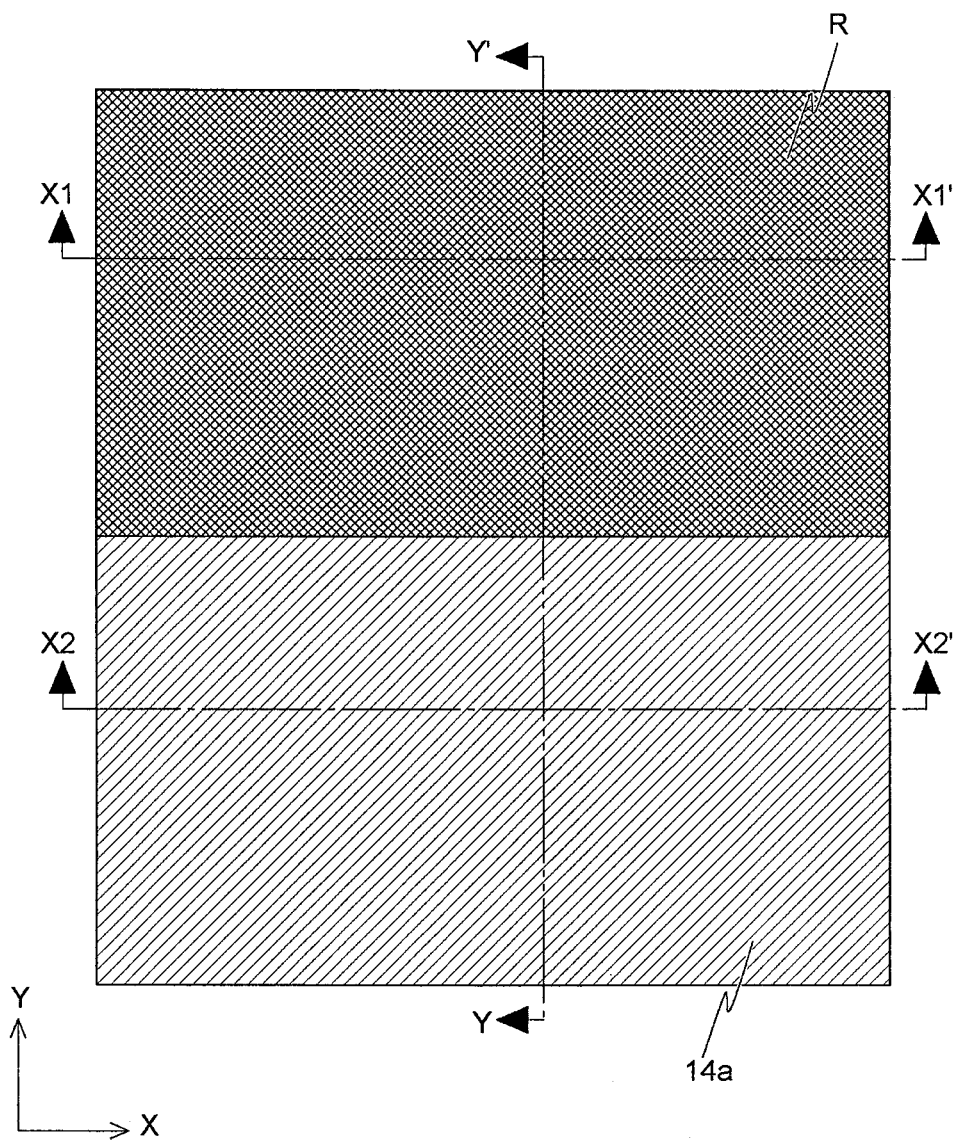
FIG. 4A is a plan view illustrating the manufacturing process of the semiconductor device according to the exemplary embodiment, FIGS. 4B to 4D being a cross-sectional view along line X1-X1', a cross-sectional view along line X2-X2', and a cross-sectional view along line Y-Y respectively in FIG. 4A.
Figure 4B:
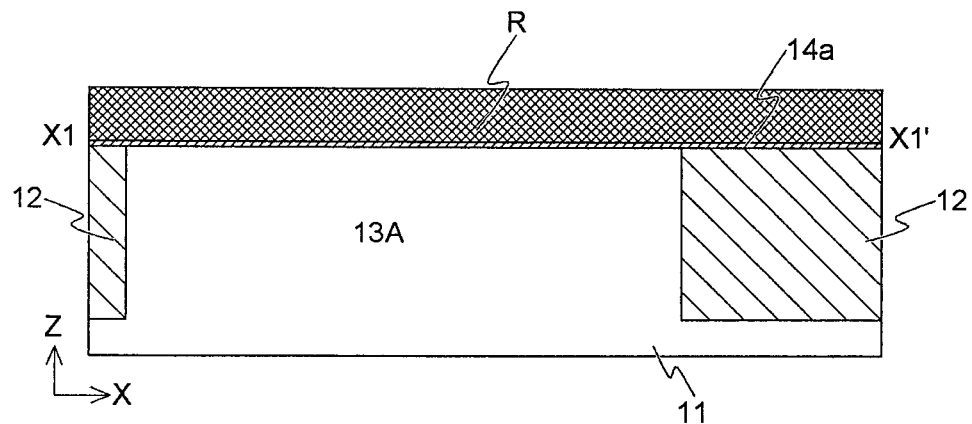
Figure 4C:
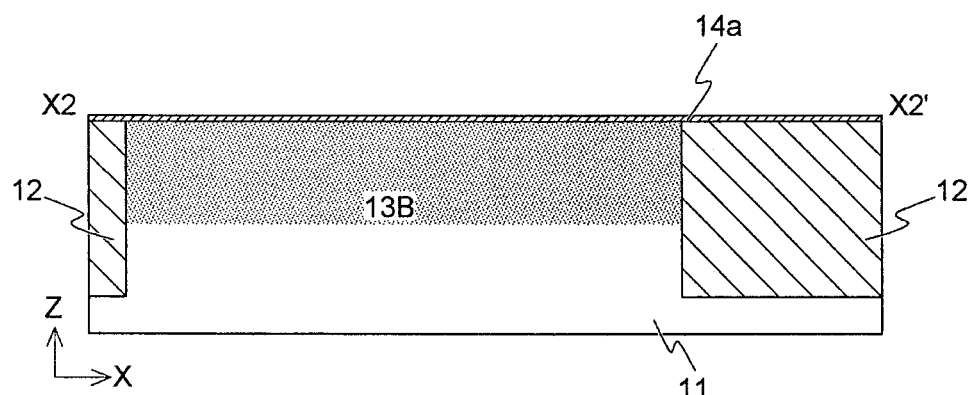
Figure 4D:
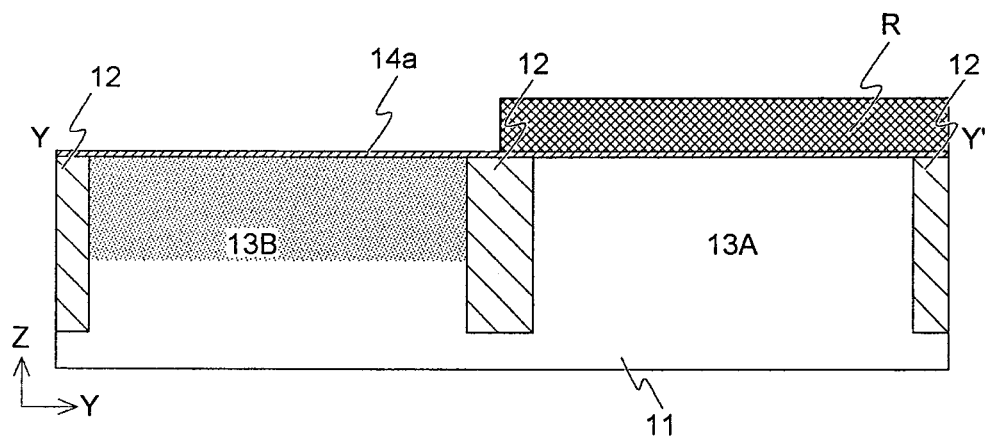
Figure 5A:
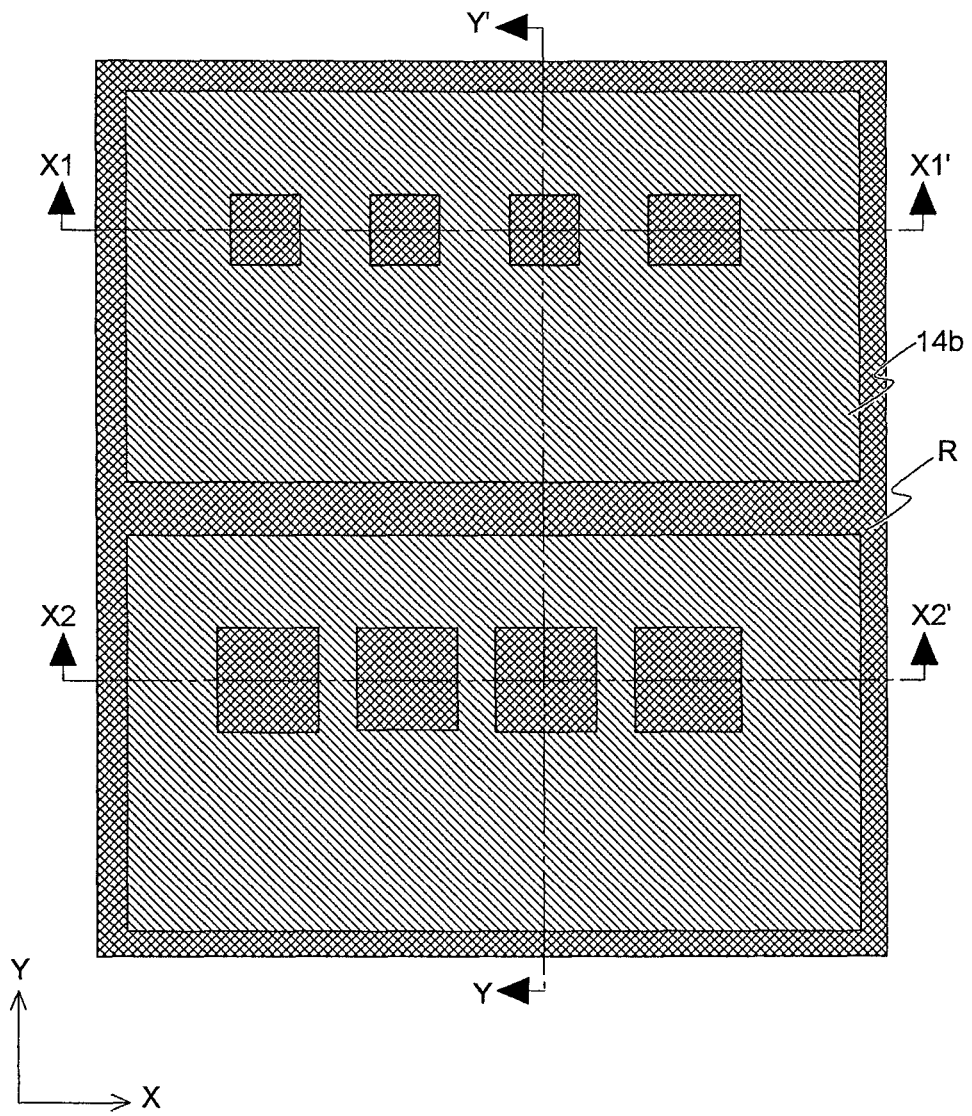
FIG. 5A is a plan view illustrating the manufacturing process of the semiconductor device according to the exemplary embodiment, FIGS. 5B to 5D being a cross-sectional view along line X1-X1', a cross-sectional view along line X2-X2', and a cross-sectional view along line Y-Y respectively in FIG. 5A.
Figure 5B:
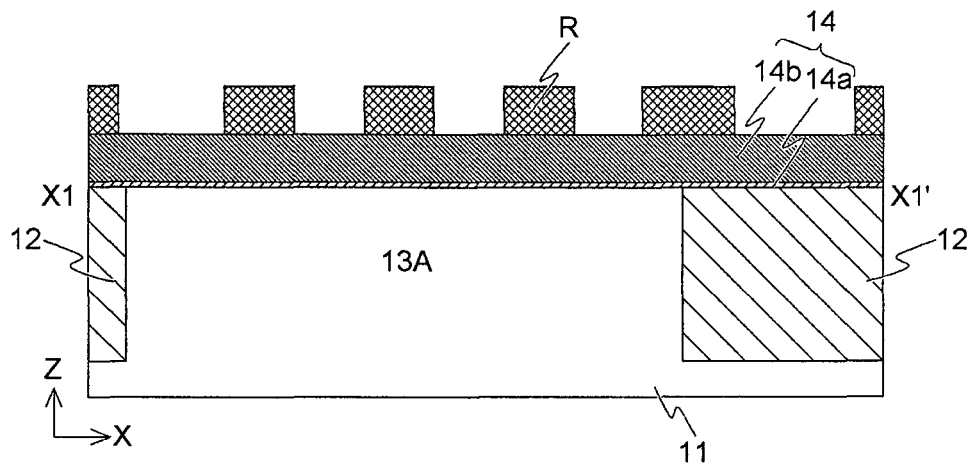
Figure 5C:
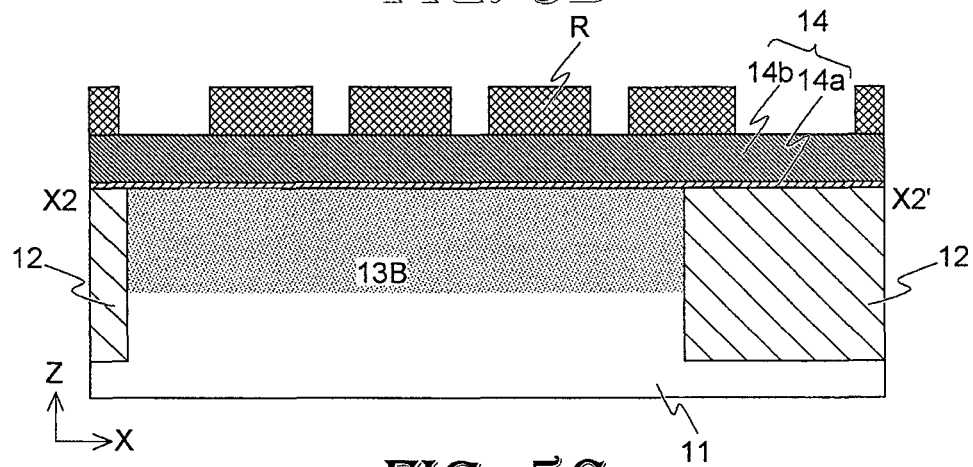
Figure 5D:
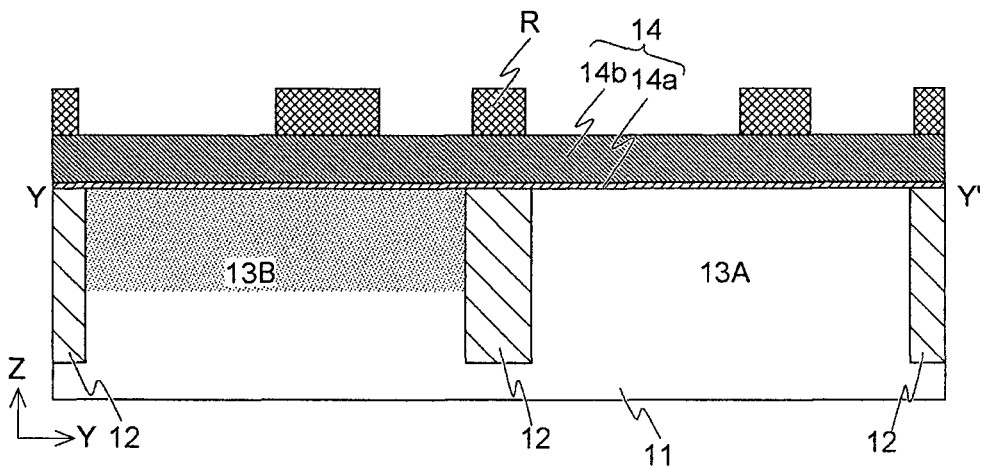
Figure 6A:
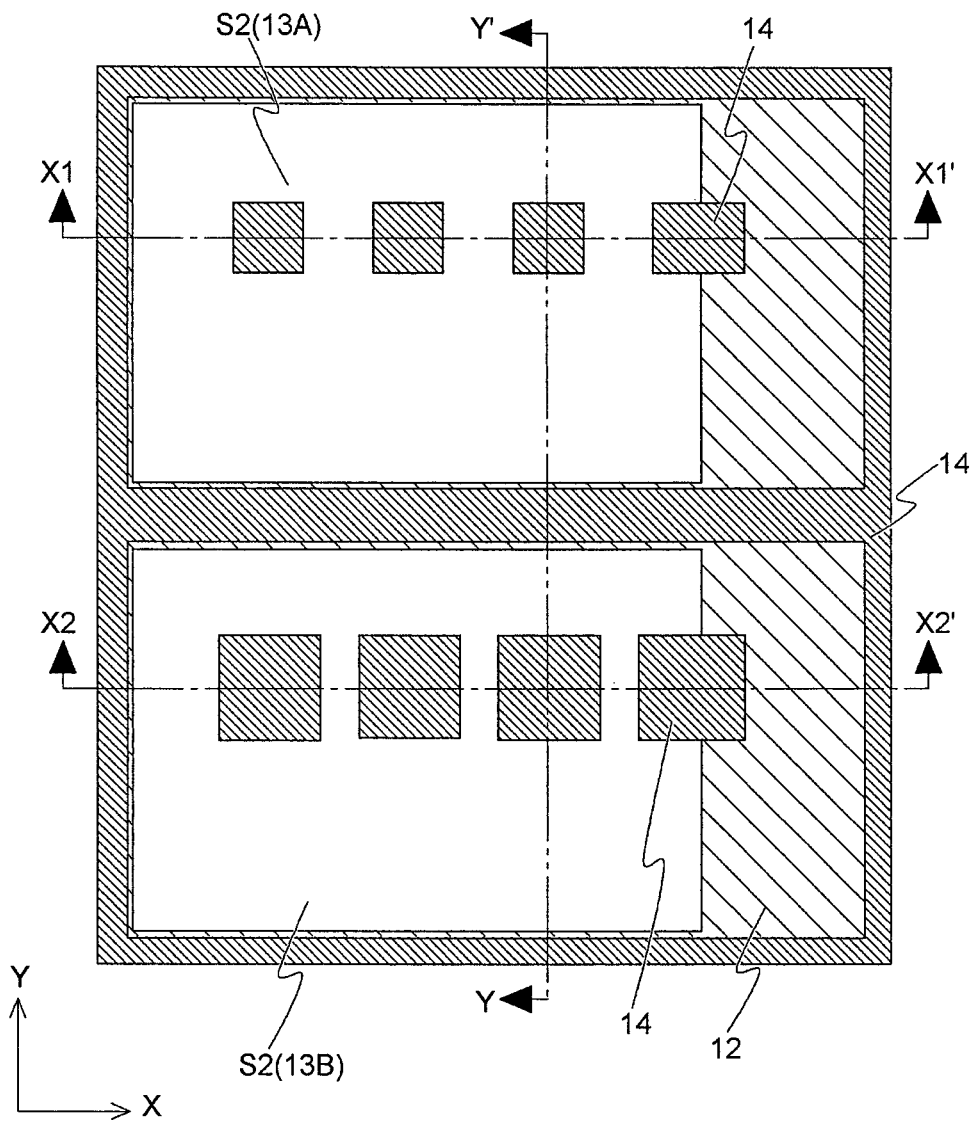
FIG. 6A is a plan view illustrating the manufacturing process of the semiconductor device according to the exemplary embodiment, FIGS. 6B to 6D being a cross-sectional view along line X1-X1', a cross-sectional view along line X2-X2', and a cross-sectional view along line Y-Y respectively in FIG. 6A.
Figure 6B:
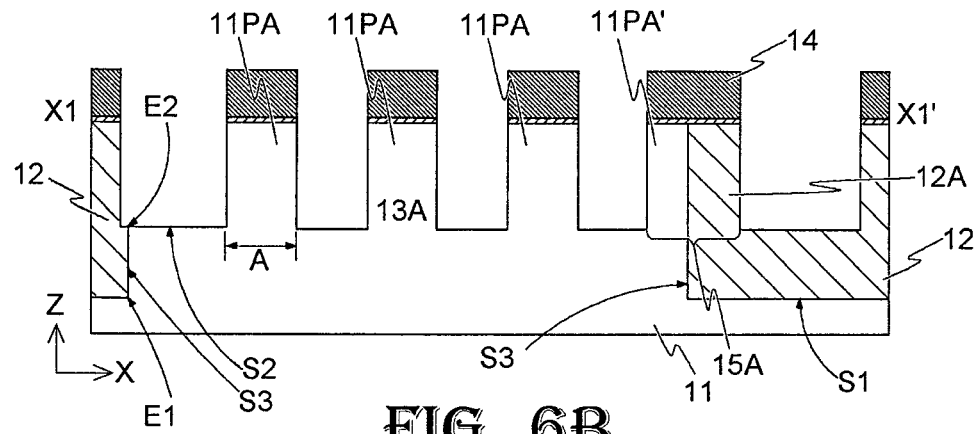
Figure 6C:
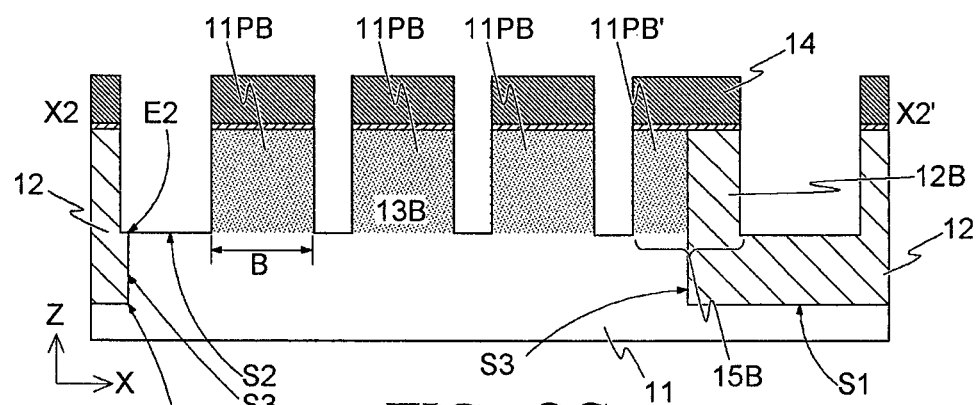
Figure 6D:
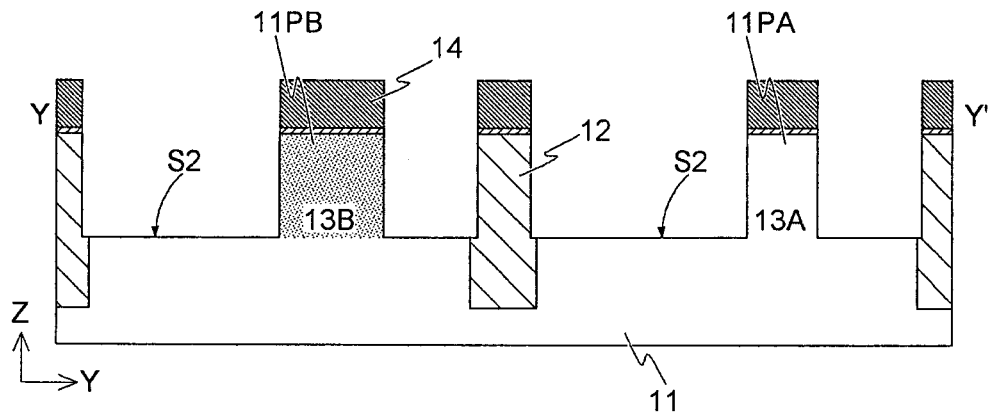
Figure 7A:
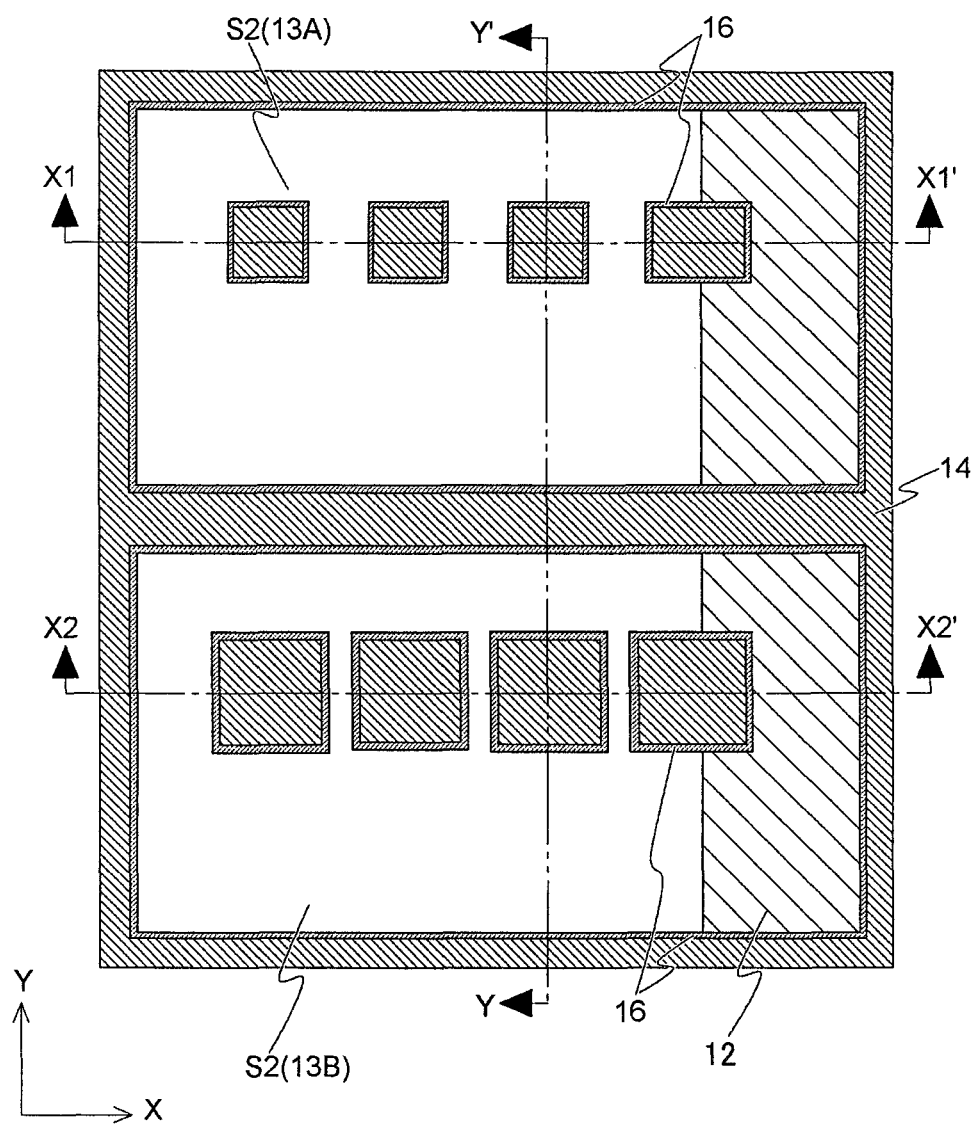
FIG. 7A is a plan view illustrating the manufacturing process of the semiconductor device according to the exemplary embodiment, FIGS. 7B to 7D being a cross-sectional view along line X1-X1', a cross-sectional view along line X2-X2', and a cross-sectional view along line Y-Y respectively in FIG. 7A.
Figure 7B:
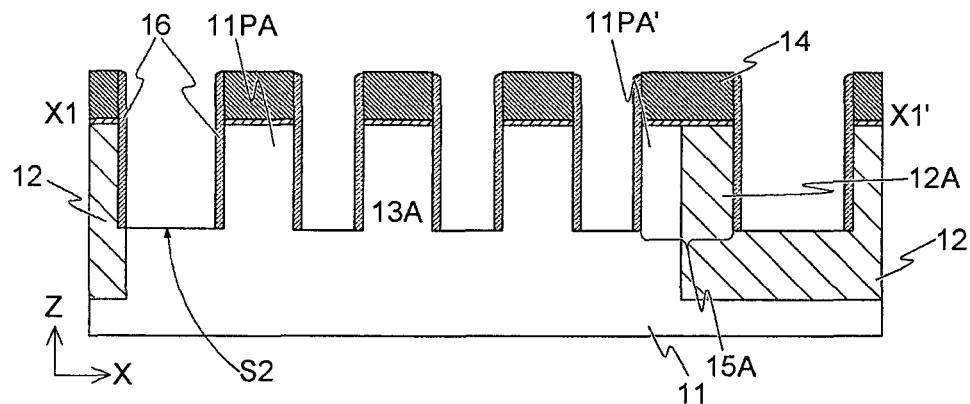
Figure 7C:
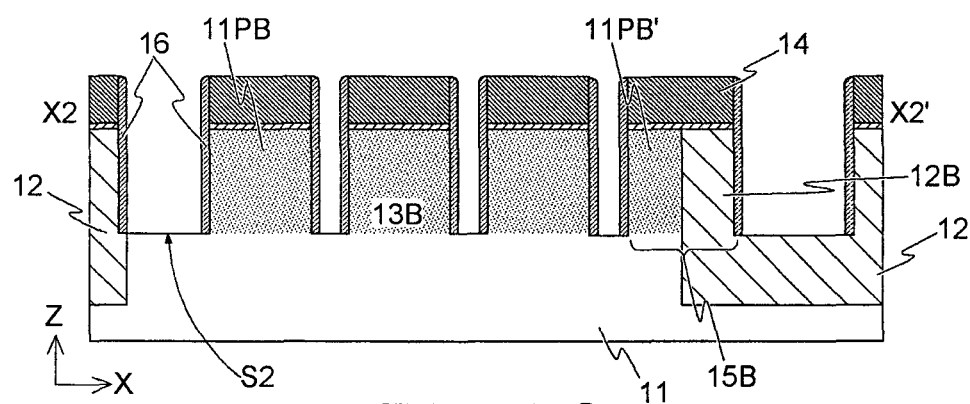
Figure 7D:
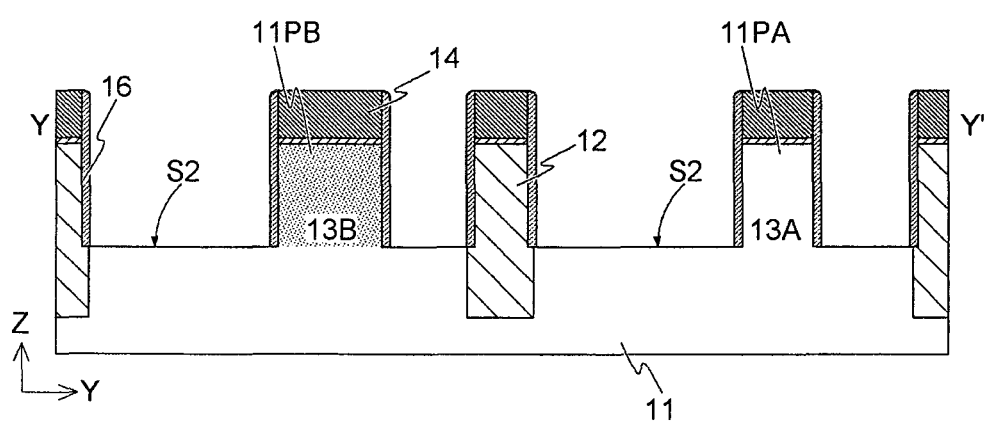

With reference to FIG. 1 and FIG. 2, a structure and an effect of a semiconductor device according to the present exemplary embodiment will be described.

FIG. 1A is a plan view of main components of semiconductor device 100 according to the present exemplary embodiment. FIG. 1B is a cross-sectional view along line X1-X1' in FIG. 1A. FIG. 1C is a cross-sectional view along line X2-X2' in FIG. 1A. FIG. 1D is a cross-sectional view along line Y-Y' in FIG. 1A. Silicon substrate (hereinafter referred to as "substrate") 11 includes first surface S1, second surface S2, and third surface S3. Second surface S2 is located above first surface S1. Third surface S3 includes first edge E1 and second edge E2 connected to first surface S1 and second surface S2, respectively. Insulation region 12 including an insulator is formed on first surface S1 and third surface S3. Substrate 11 includes second surface S2 and active region 13 fenced with the insulator in insulation region 12. In FIG. 1B, first active portion 13A includes three first semiconductor pillars 11PA' protruding from second surface S2; and in a boundary between first active portion 13A and isolation region 12, first semiconductor portion 11PA' protruding from second surface S2 and first insulator portion 12A disposed as the insulator of insulation region 12 are combined to form first gate pillar 15A. The three first semiconductor pillars 11PA are surrounded with first gate electrode 20A continuing from first gate pillar 15A. First gate electrode 20A is connected to first conductive layer 30-1 through first contact plug 29-1 in a portion of first gate pillar 15A in isolation region 12. Similarly in FIG. 10, second active portion 13B includes three second semiconductor pillars 11PB protruding from second surface S2; and in a boundary between second active portion 13B and isolation region 12, second semiconductor portion 11PB' protruding from second surface S2 and second insulator portion 12B disposed as the insulator of insulation region 12 are combined to form second gate pillar 15B. The three second semiconductor pillars 11PB are surrounded with second gate electrode 20B continuing from second gate pillar 15B. Second gate electrode 20B is connected to second conductive layer 30-2 through second contact plug 29-2 in a portion of second gate pillar 15B in isolation region 12. Second semiconductor pillar 11PB has pillar width B (second pillar width) 10 to 20 nm larger than pillar width A (first pillar width) of first semiconductor pillar 11PA.

With reference to FIG. 1D, first LDD layer 24A is provided in an upper portion of first semiconductor pillar 11PA, and further first upper diffusion layer 26A is provided thereon. Second LDD layer 24B is provided in an upper portion of second semiconductor pillar 11PB, and further second upper diffusion layer 26B is provided thereon. Lower diffusion layer 18 is disposed on an entire surface of second surface S2 under bottom silicon oxide film 17 in a lower portion of first semiconductor pillar 11PA and second semiconductor pillar 11PB. Upper diffusion layers 26A and 26B are connected to third and fourth conductive layers 30-3 and 30-4 through third and fourth contact plugs 29-3 and 29-4 respectively. Lower diffusion layer 18 is set to a prescribed potential, and thus is connected to common fifth conductive layer 30-5. Here, in first active portion 13A, lower diffusion layer 18 (first lower diffusion portion 18A) is connected to first wiring portion 30-5-1 of fifth conductive layer 30-5 through fifth contact plug 29-5. In second active portion 13B, lower diffusion layer 18 (second lower diffusion portion 18B) is connected to second wiring portion 30-5-2 of fifth conductive layer 30-5 through sixth contact plug 29-6. First semiconductor pillar 11PA between first upper diffusion layer 26A and first lower diffusion portion 18A serves as channel region (first channel region 31A) of first pillar-FET. Second semiconductor pillar 11PB between second upper diffusion layer 26B and lower diffusion layer 18 serves as channel region (second channel region 31B) of second pillar-FET. This example indicates that an impurity concentration of second channel region 31B is higher than the impurity concentration of first channel region 31A.

FIG. 2 is a graph illustrating a relation between a pillar width and a threshold voltage (absolute value) for each impurity concentration (C1 to C8) of the channel region. Note that in this description, the term "pillar width" refers to the shortest distance in the plane direction of a silicon pillar serving as a channel region; if the silicon pillar is of a polygonal planar shape, the term "pillar width" refers to a diameter of an inscribed circle (short side width) thereof; and if the silicon pillar is of an elliptical shape, the term "pillar width" refers to a shorter diameter of the elliptical shape.

As illustrated in FIG. 2, the smaller the pillar width is, the larger change in the impurity concentration is required to obtain the same change in the threshold voltage. If the concentration is too low or too high, the problem as described in the related art will occur.

In light of this, a pillar-FET of a standard threshold voltage such as a pillar-FET of Vta, Vtb, or Vtc in FIG. 2 is designed as pillar width A (a4, a5, or a6), and a pillar-FET of a threshold voltage lower or higher than the standard threshold voltage such as a pillar-FET of Vtd or Vte in FIG. 2 is designed as pillar width B (b3 or b6), thereby allowing the pillar-FETs to be designed in a range without the problem as described in the related art. Since Vtc of pillar width A (a6) in FIG. 2 has the same impurity concentration (C6) as Vte of pillar width B (b6), pillar-FETs having the two types of threshold voltages can be formed in the same ion-implantation process.

Here, referring back to FIG. 1, the description will continue. For example, in the first pillar-FET of pillar width A as illustrated in FIG. 1B, the pillar-FET of Vtb (first threshold voltage) is designed as impurity concentration C5 (a5); and in the second pillar-FET of pillar width B as illustrated in FIG. 10, the pillar-FET of Vte (second threshold voltage) is designed as high impurity concentration C6 (b6), which results in not only a difference in threshold voltage due to a difference in impurity concentration of the channel region but also a difference in threshold voltage due to a difference in pillar width. Thus, two types of transistors with a large difference in threshold voltage can be formed on the same substrate. In contrast to this, another configuration may be made such that in the first pillar-FET of pillar width A, the pillar-FET of Vta (first threshold voltage) is designed as impurity concentration C4 (a4); and in the second pillar-FET of pillar width B, the pillar-FET of Vtd (second threshold voltage) is designed as a low impurity concentration C3 (b3). If the first pillar-FET with pillar width A is designed as impurity concentration C8 (a8) and the second pillar-FET with pillar width B is designed as impurity concentration C7 (b7), the difference in threshold voltage due to the difference in channel impurity concentration is canceled, resulting in the dominance of the difference in threshold voltage due to the difference in pillar width. In other words, a reverse phenomenon of the threshold voltage unexpected from the related art occurs. Similarly, even if the first pillar-FET with pillar width A is designed as impurity concentration C1 (a1), and the second pillar-FET with pillar width B is designed as higher impurity concentration C2 (b2), a reverse phenomenon of the threshold voltage occurs. Note that as illustrated in FIG. 2, when the pillar width is increased to some extent, a change in pillar width does not affect the difference in threshold voltage due to the difference in channel impurity concentration. The pillar width A is preferably equal to or less than 100 nm, and pillar width B is preferably greater than pillar width A by 10 nm or more. In FIG. 2, the gate insulating films are made of the same material and are formed so as to have substantially the same thickness. Note that the present invention can also be implemented by a combination of an adjustment of the threshold voltages by changing the thickness and the material (different in dielectric constant) of the gate insulating films, which requires an addition of a manufacturing process more complicated than the change in channel impurity concentration.

Now, a structure and a manufacturing method of the semiconductor device according to the present exemplary embodiment will be described in detail.

Figure 8A:
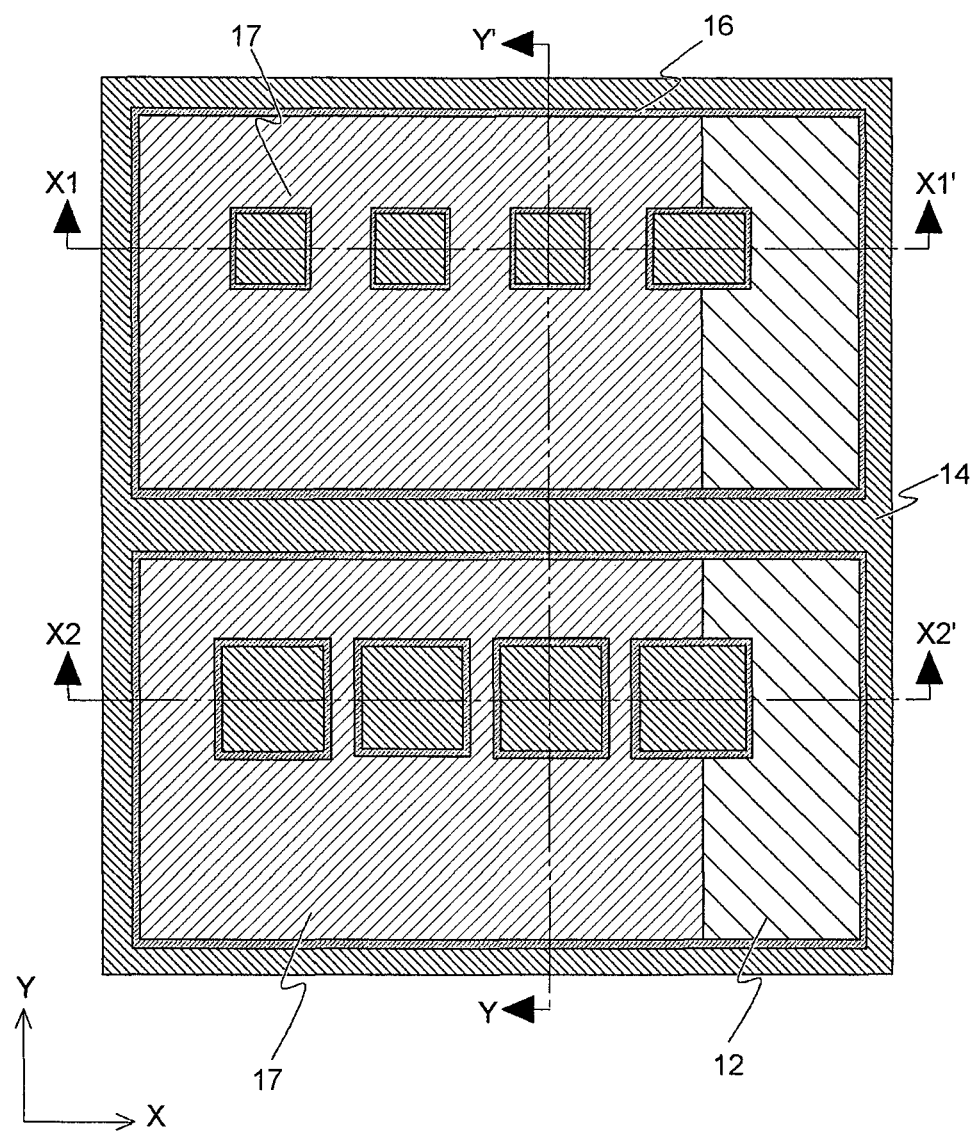
FIG. 8A is a plan view illustrating the manufacturing process of the semiconductor device according to the exemplary embodiment, FIGS. 8B to 8D being a cross-sectional view along line X1-X1', a cross-sectional view along line X2-X2', and a cross-sectional view along line Y-Y respectively in FIG. 8A.
Figure 8B:
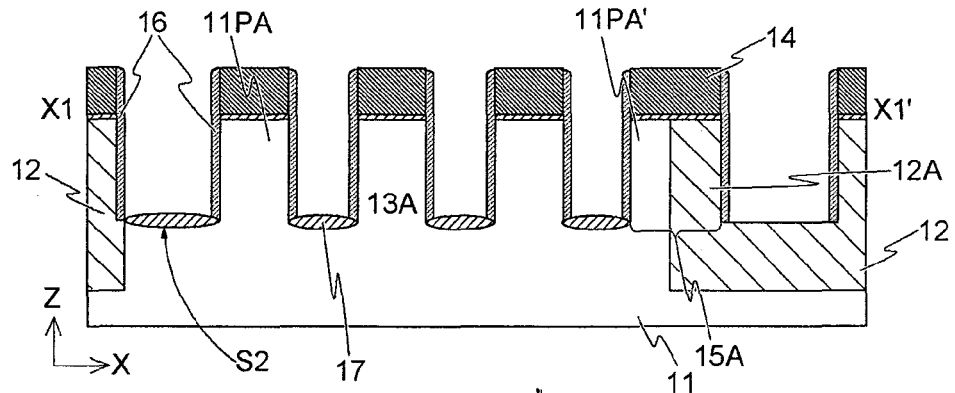
Figure 8C:
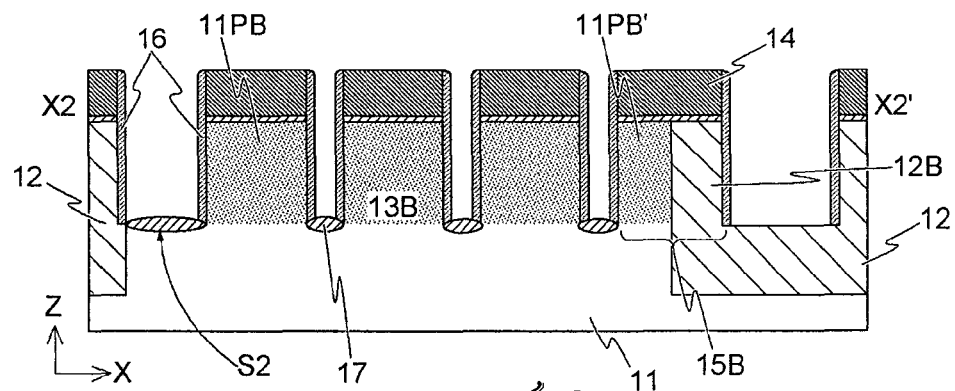
Figure 8D:
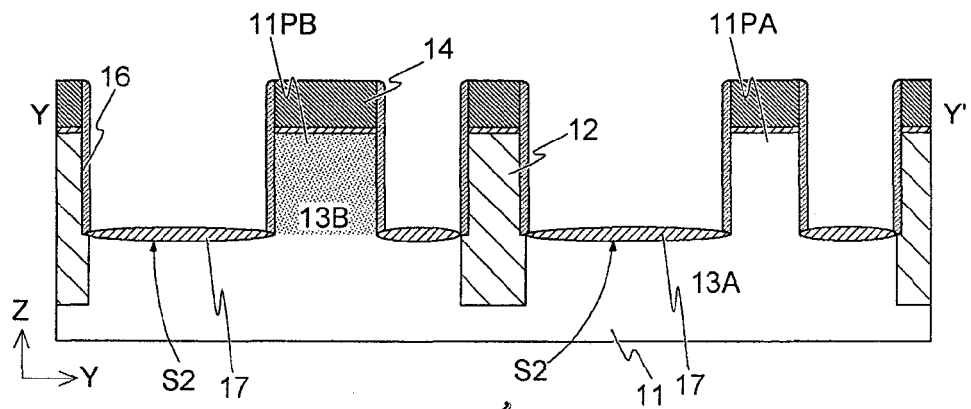
Figure 9B:
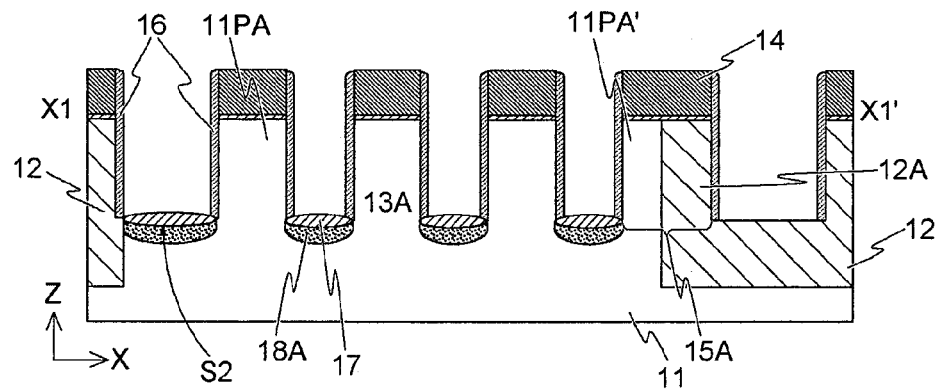
FIGS. 9B to 9D each illustrate a cross-sectional view corresponding to line X1-X1', a cross-sectional view corresponding to line X2-X2', and a cross-sectional view corresponding to line Y-Y respectively in FIG. 8A illustrating the manufacturing process of the semiconductor device according to the exemplary embodiment.
Figure 9C:
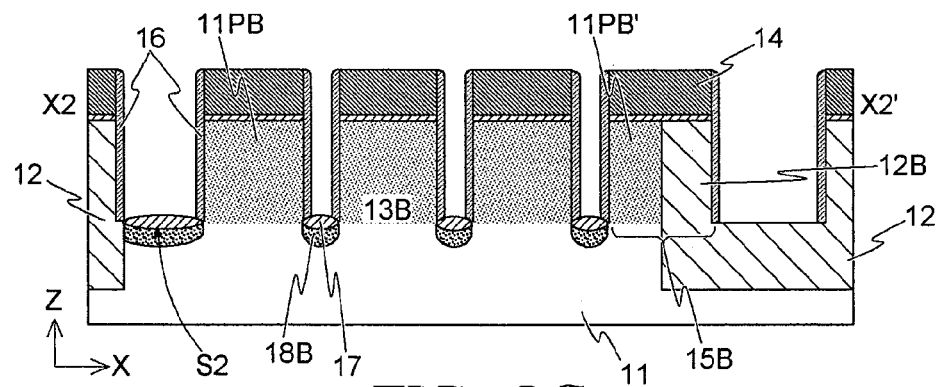
Figure 9D:
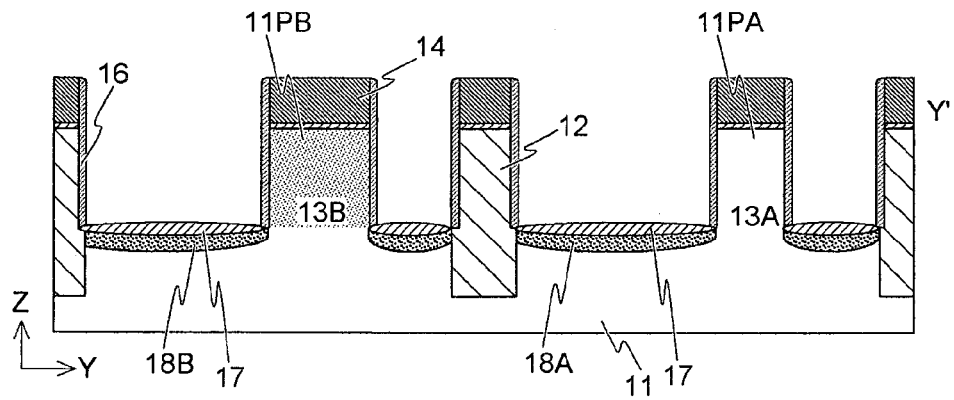
Figure 10A:
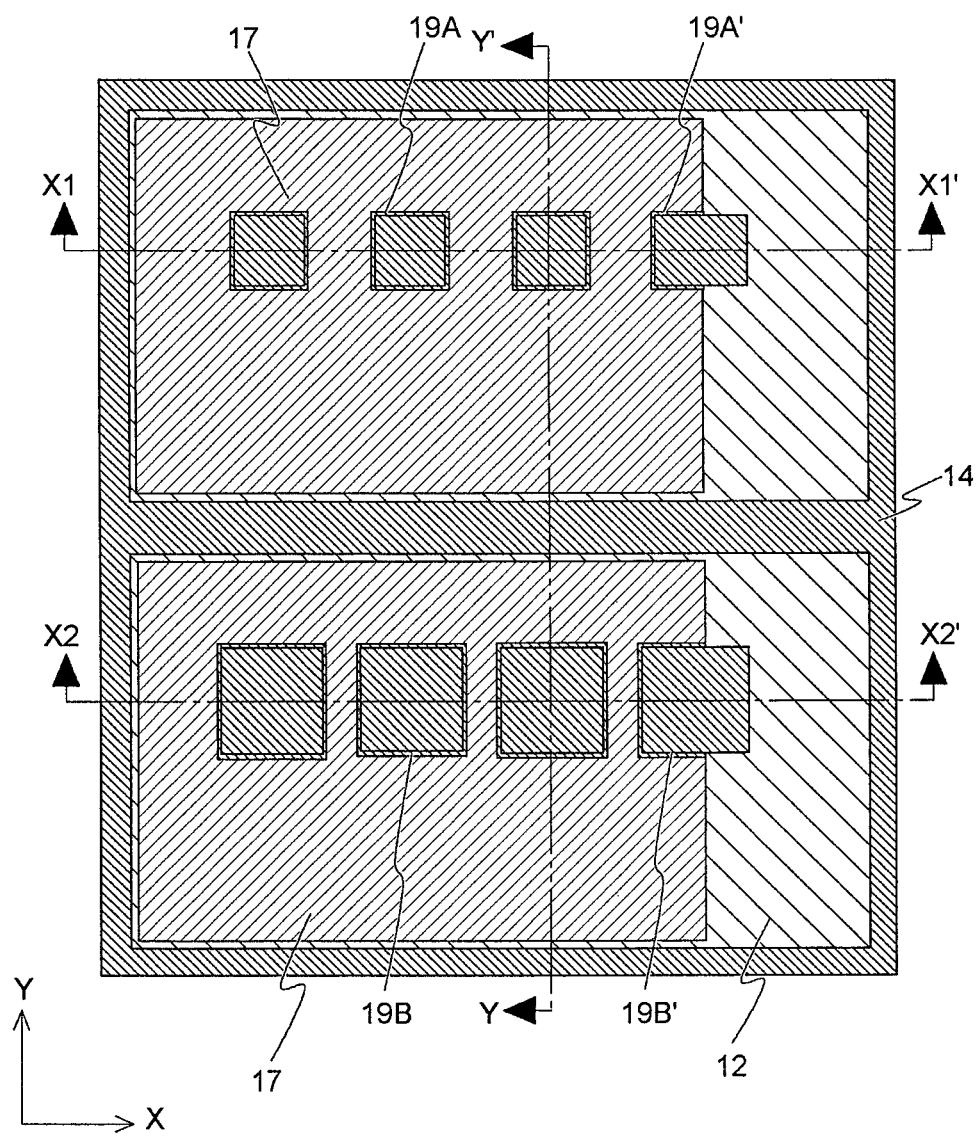
FIG. 10A is a plan view illustrating the manufacturing process of the semiconductor device according to the exemplary embodiment, FIGS. 10B to 10D being a cross-sectional view along line X1-X1', a cross-sectional view along line X2-X2', and a cross-sectional view along line Y-Y respectively in FIG. 10A.
Figure 10B:
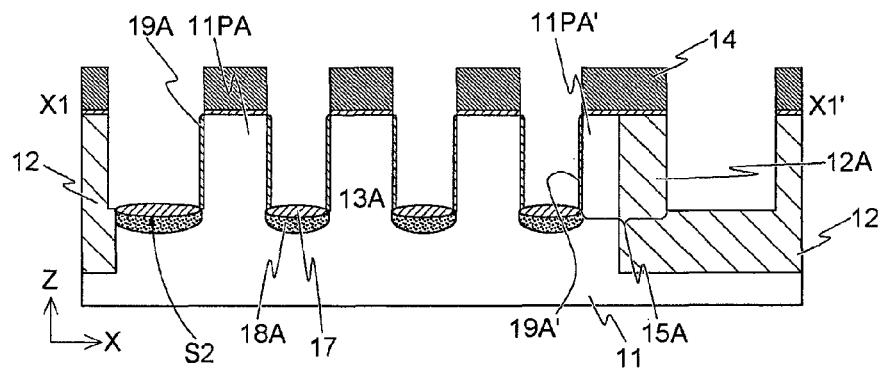
Figure 10C:
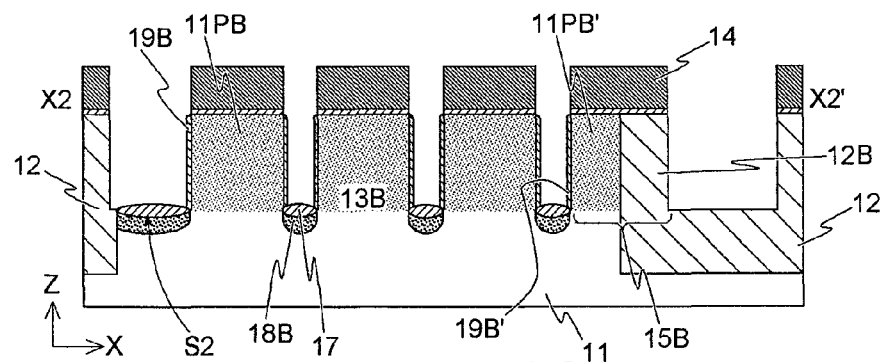
Figure 10D:
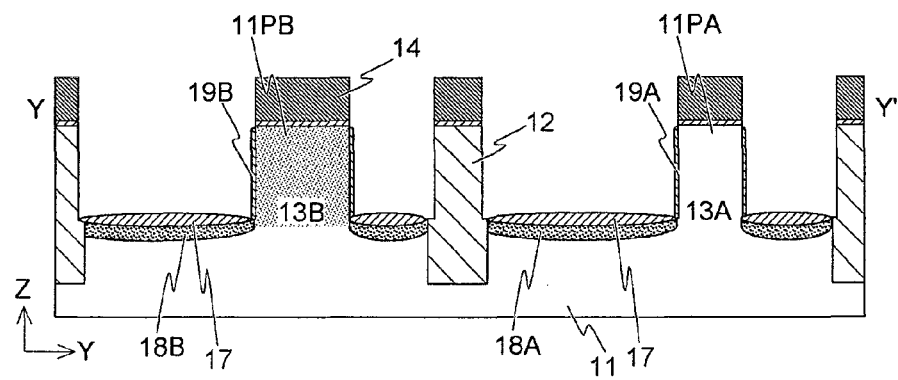
Figure 11A:
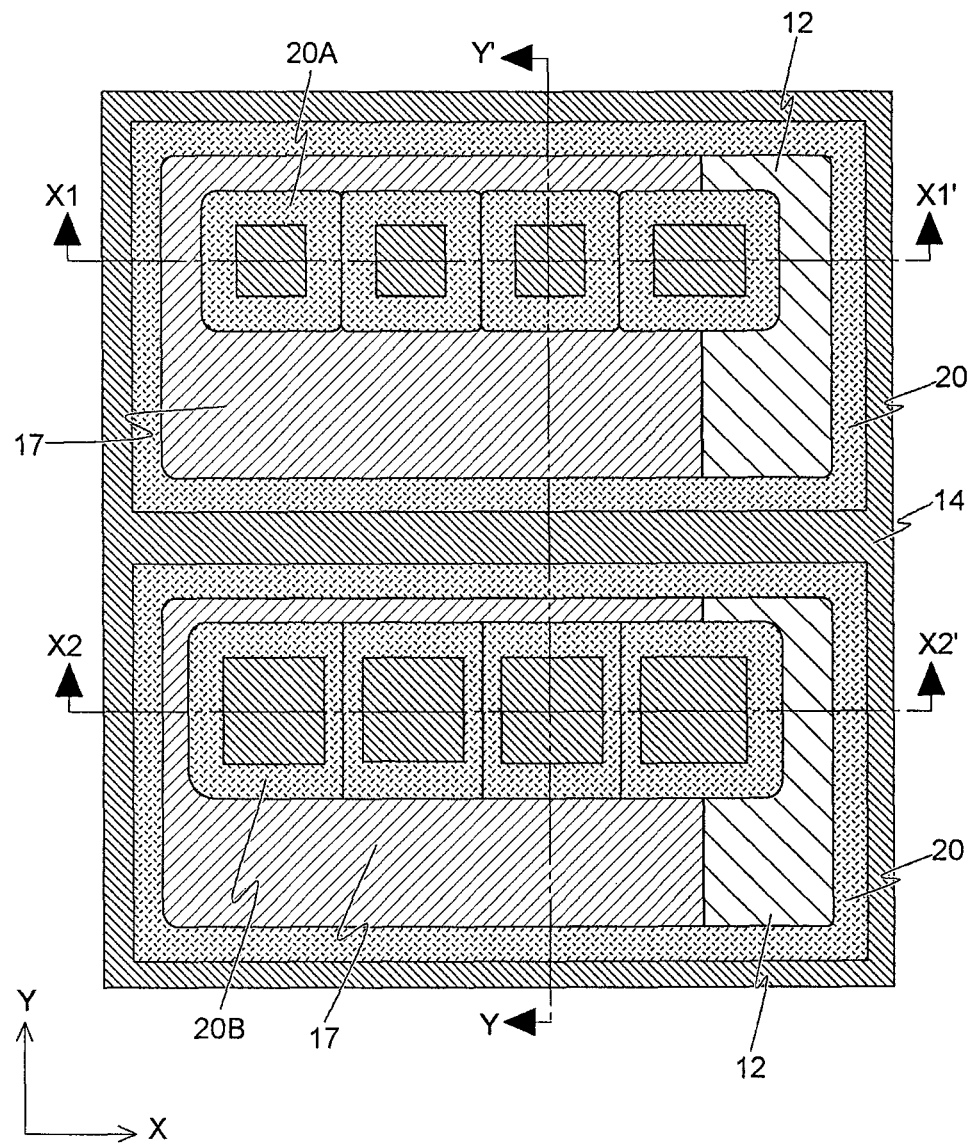
FIG. 11A is a plan view illustrating the manufacturing process of the semiconductor device according to the exemplary embodiment, FIGS. 11B to 11D being a cross-sectional view along line X1-X1', a cross-sectional view along line X2-X2', and a cross-sectional view along line Y-Y respectively in FIG. 11A.
Figure 11B:
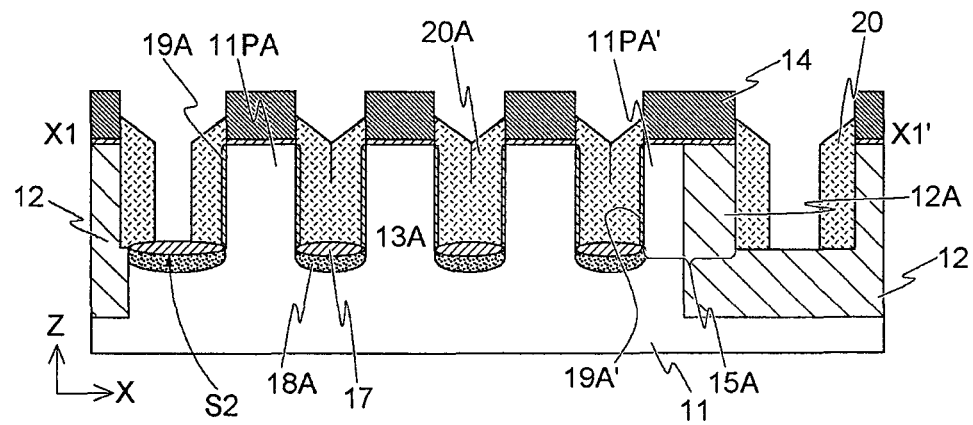
Figure 11C:
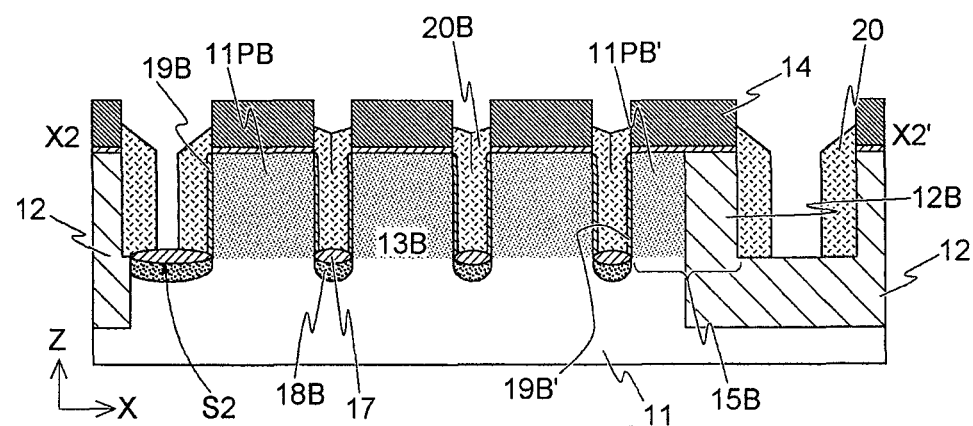
Figure 11D:
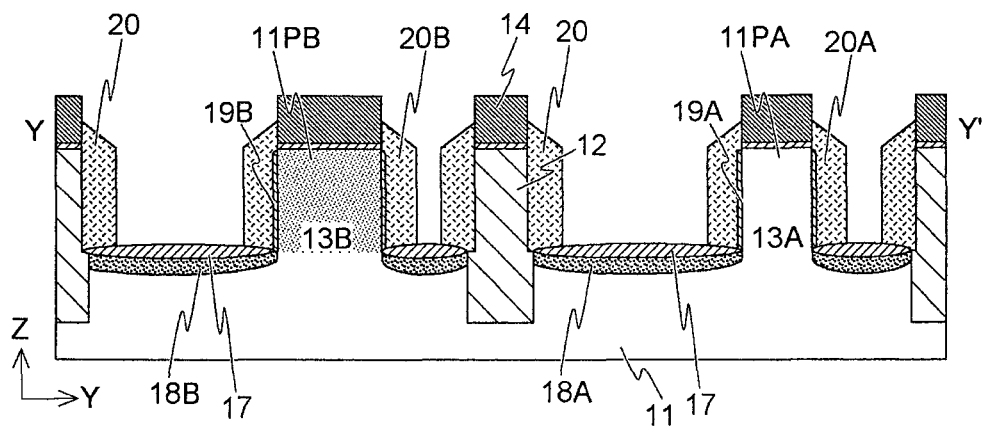
Figure 12A:
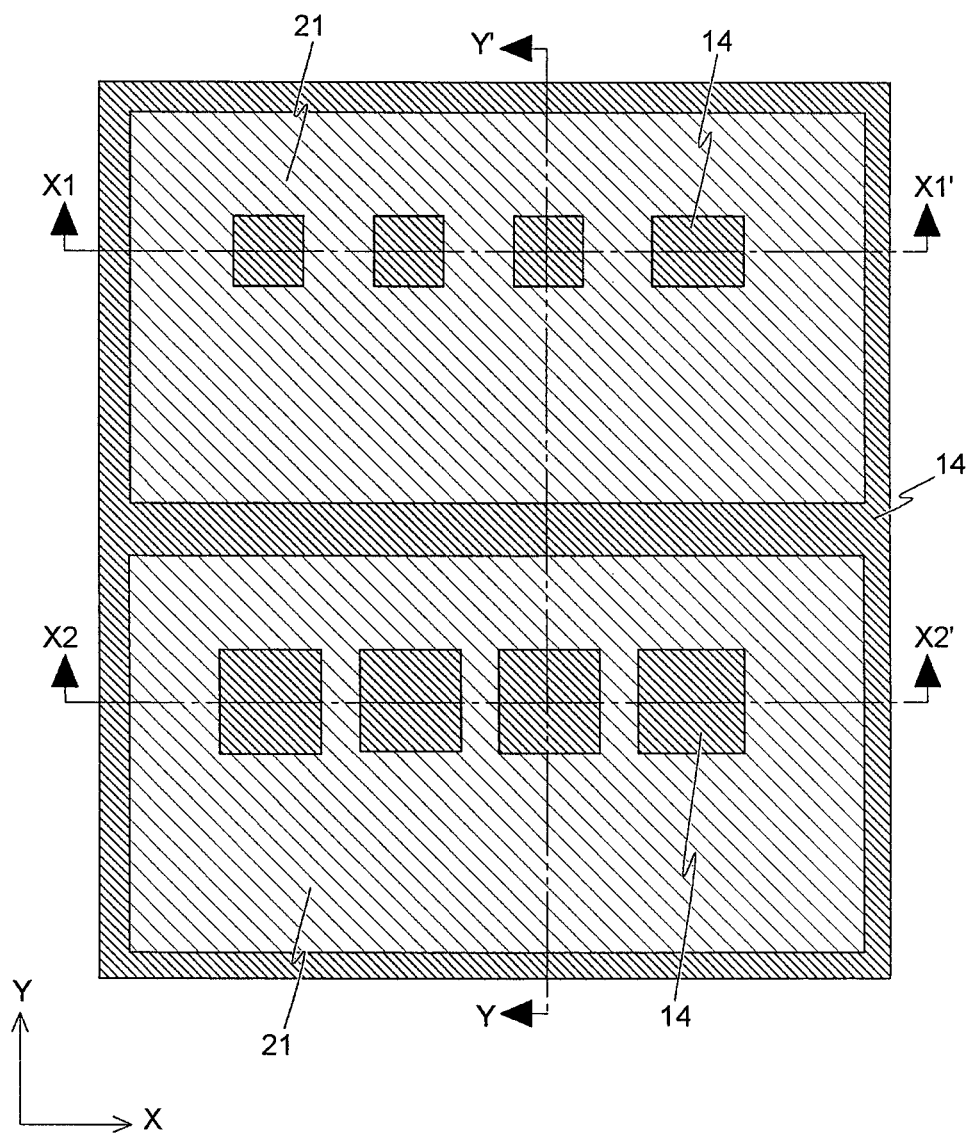
FIG. 12A is a plan view illustrating the manufacturing process of the semiconductor device according to the exemplary embodiment, FIGS. 12B to 12D being a cross-sectional view along line X1-X1', a cross-sectional view along line X2-X2', and a cross-sectional view along line Y-Y respectively in FIG. 12A.
Figure 12B:
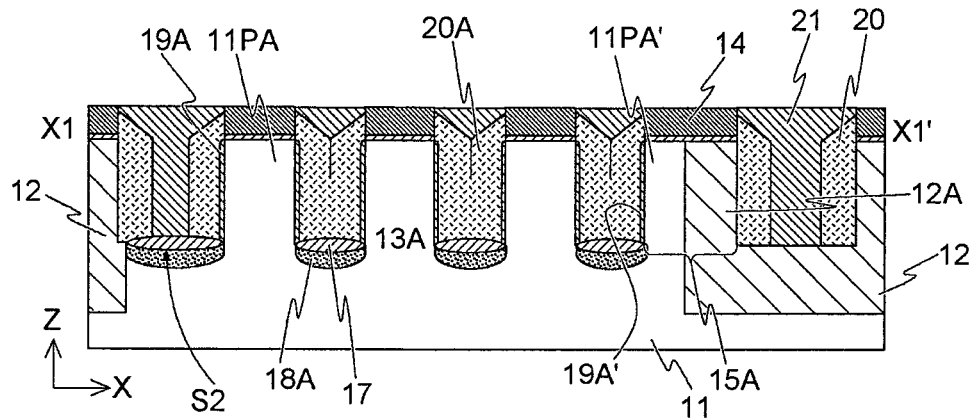
Figure 12C:
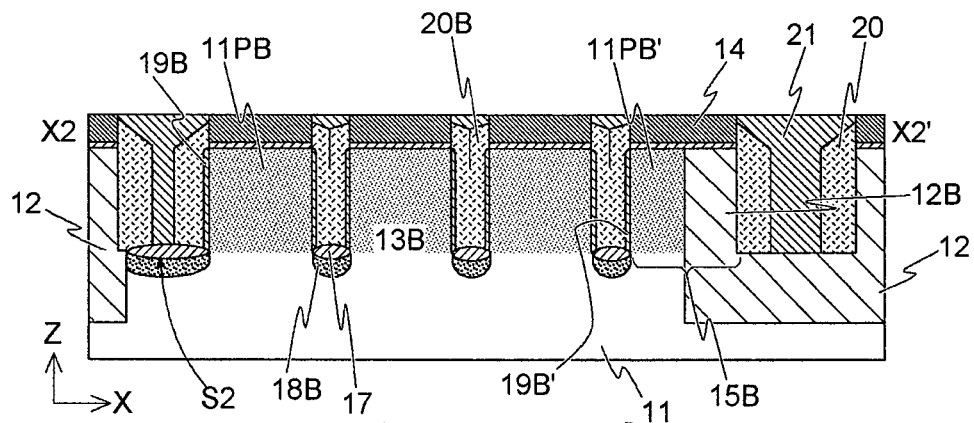
Figure 12D:
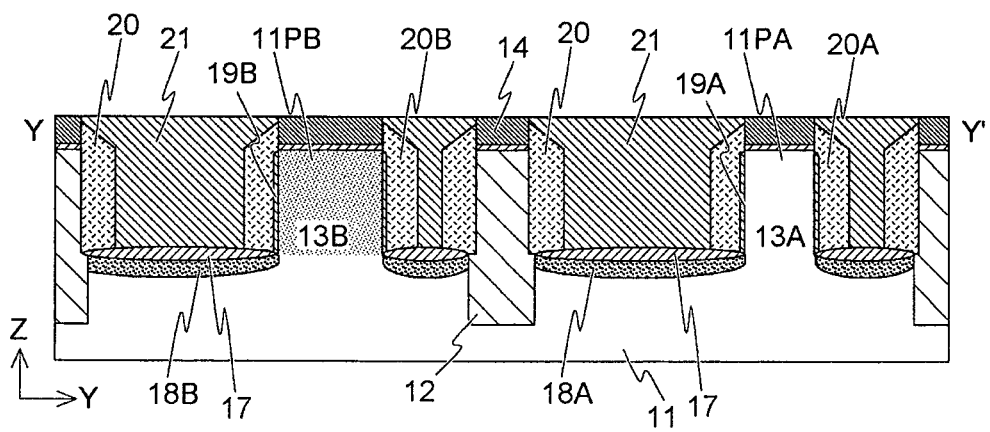
Figure 13A:
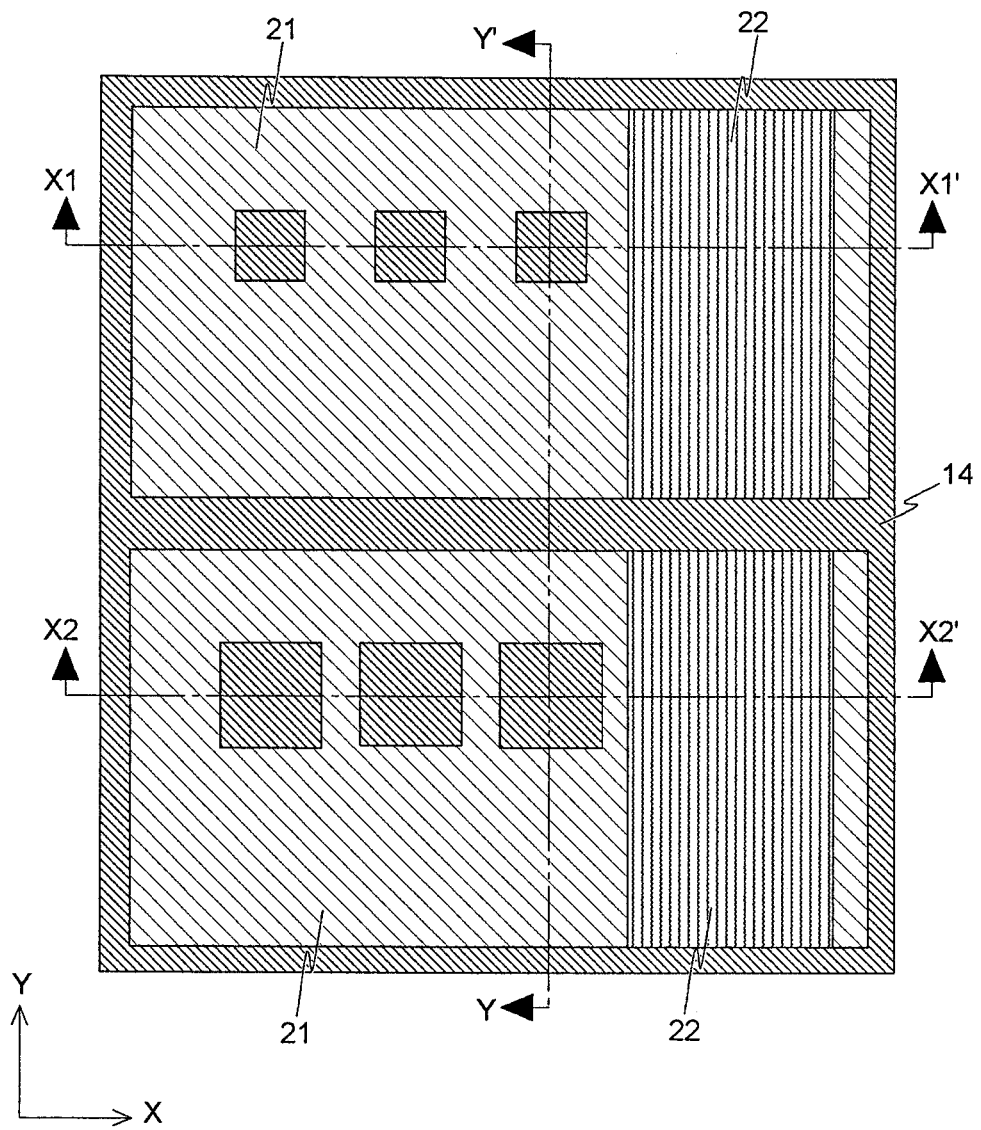
FIG. 13A is a plan view illustrating the manufacturing process of the semiconductor device according to the exemplary embodiment, FIGS. 13B to 13D being a cross-sectional view along line X1-X1', a cross-sectional view along line X2-X2', and a cross-sectional view along line Y-Y respectively in FIG. 13A.
Figure 13B:
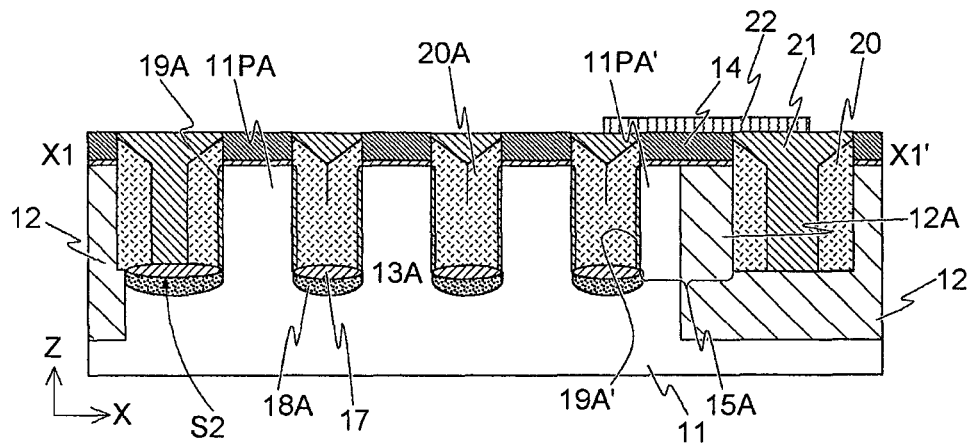
Figure 13C:
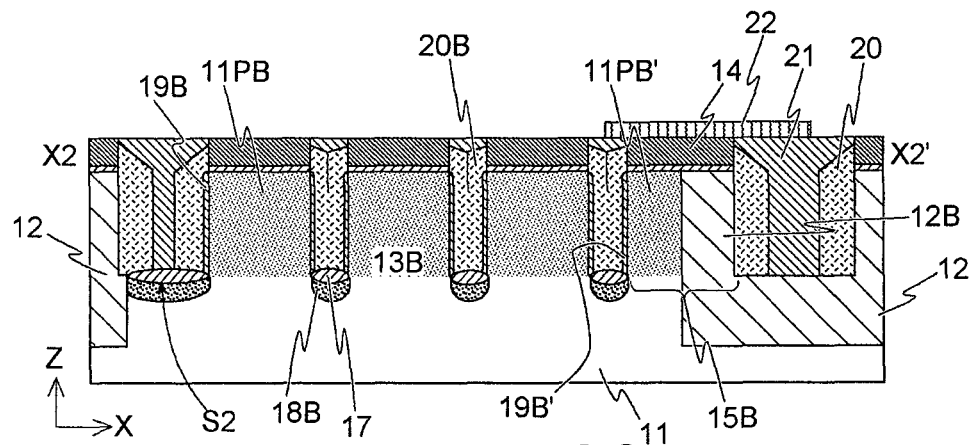
Figure 13D:
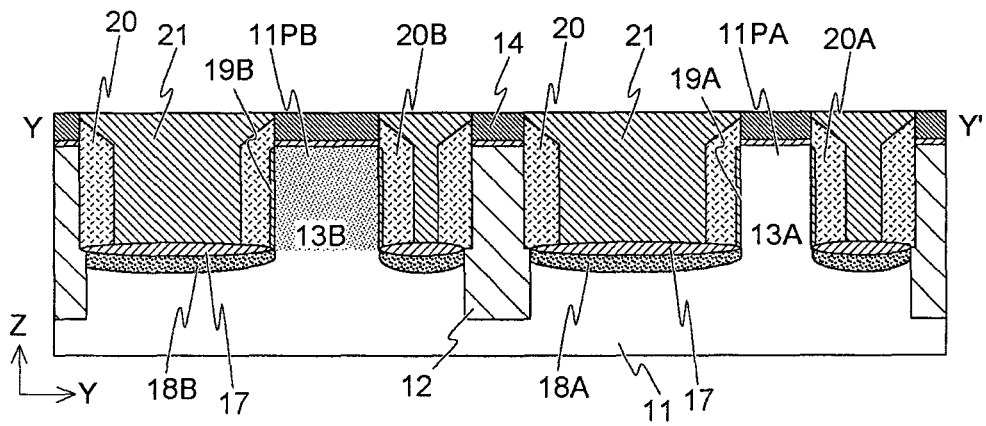
Figure 14A:
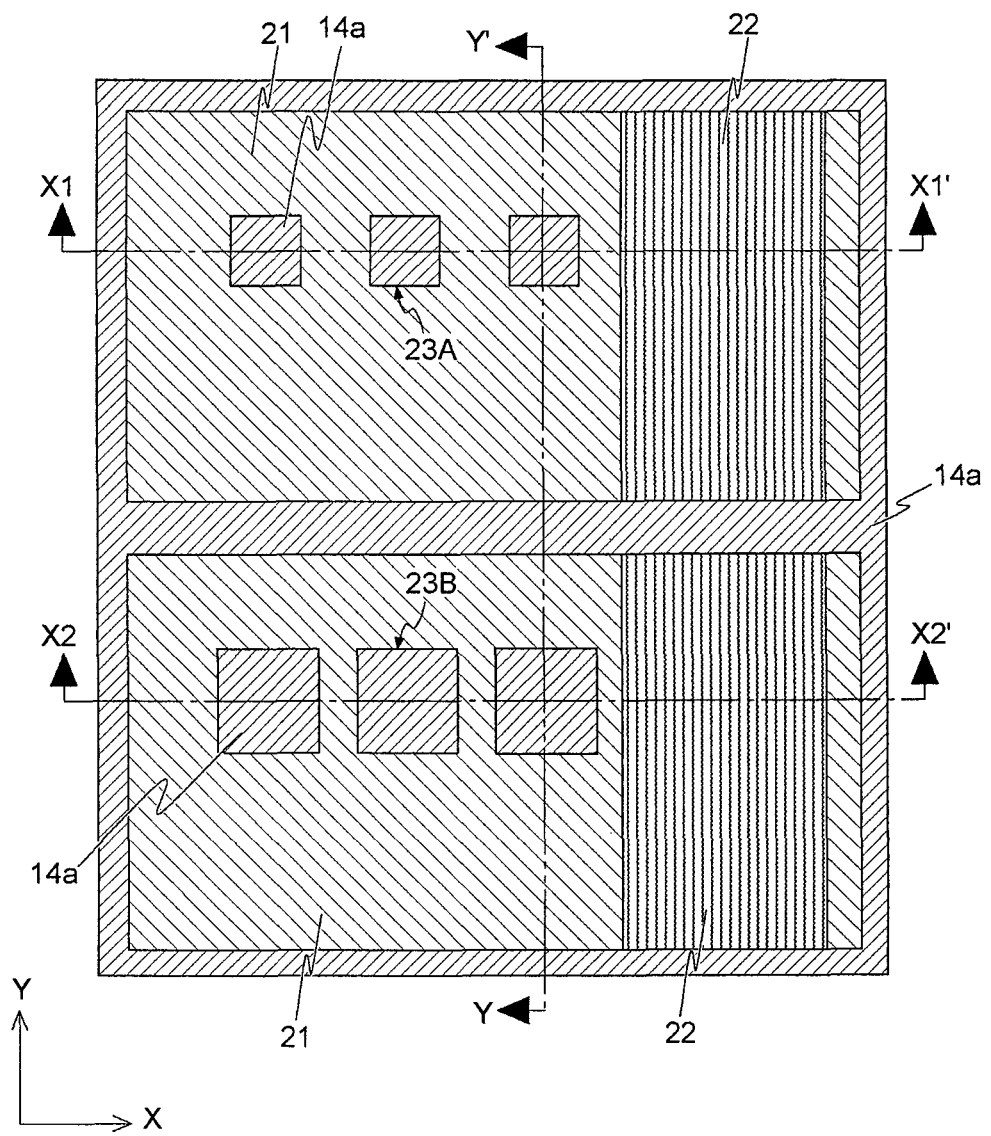
FIG. 14A is a plan view illustrating the manufacturing process of the semiconductor device according to the exemplary embodiment, FIGS. 14B to 14D being a cross-sectional view along line X1-X1', a cross-sectional view along line X2-X2', and a cross-sectional view along line Y-Y respectively in FIG. 14A.
Figure 14B:
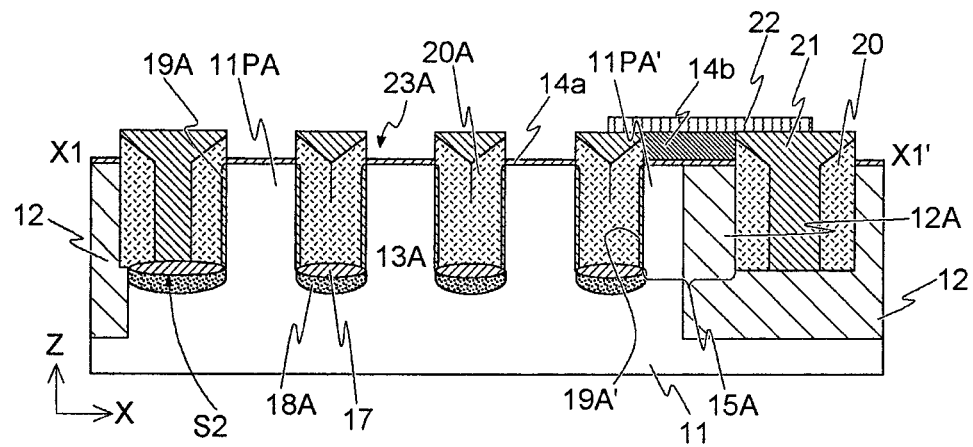
Figure 14C:
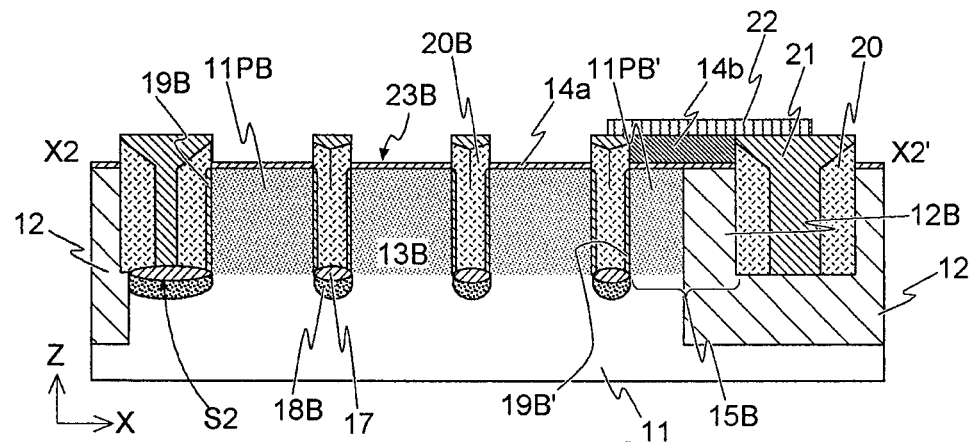
Figure 14D:
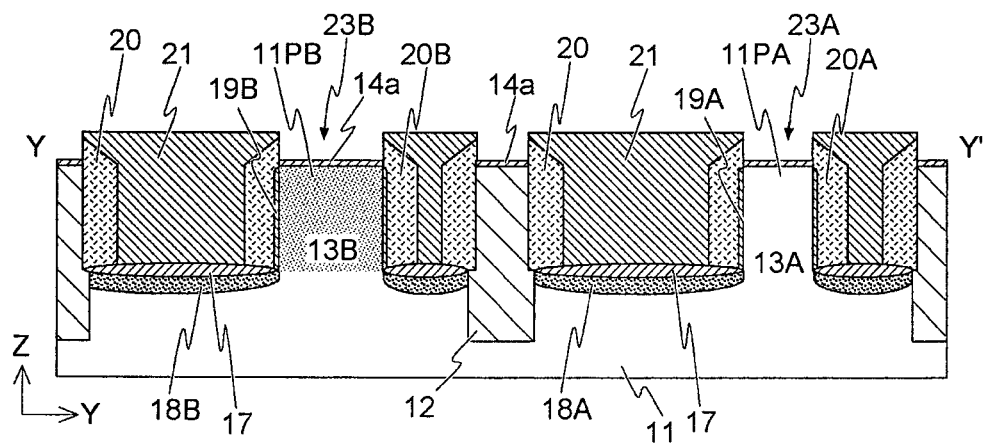
Figure 15B:
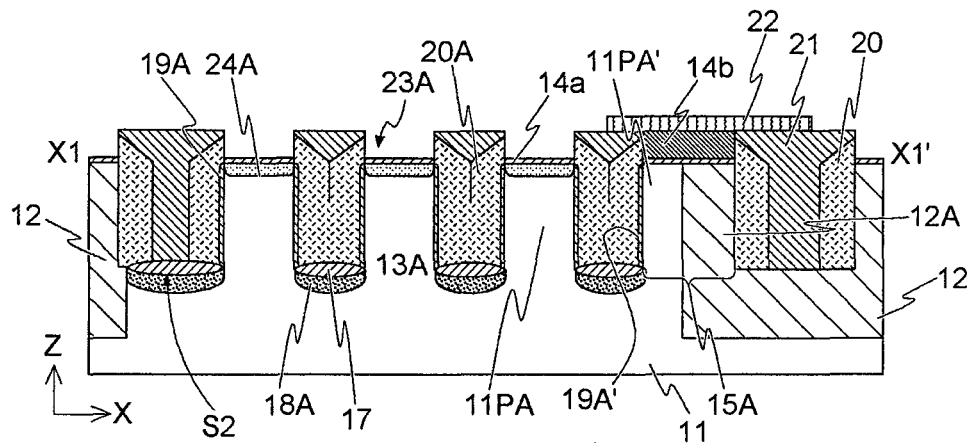
FIGS. 15B to 15D each illustrate a cross-sectional view corresponding to line X1-X1', a cross-sectional view corresponding to line X2-X2', and a cross-sectional view corresponding to line Y-Y respectively in FIG. 14A illustrating the manufacturing process of the semiconductor device according to the exemplary embodiment.
Figure 15C:
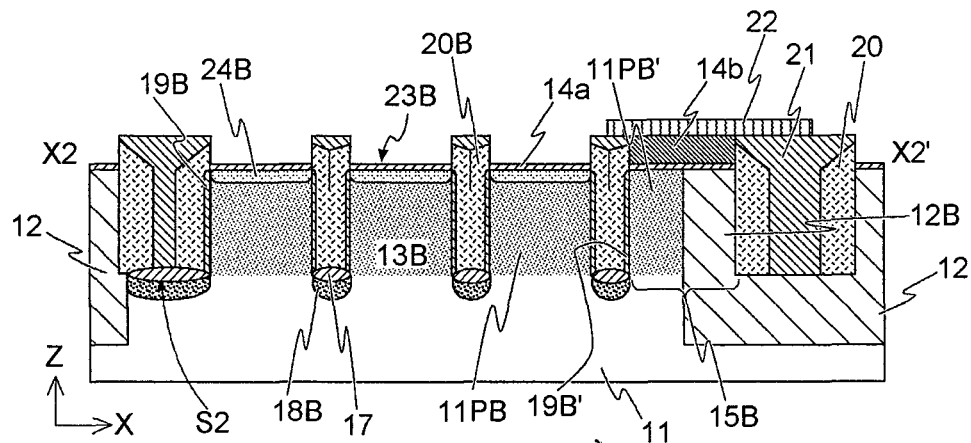
Figure 15D:
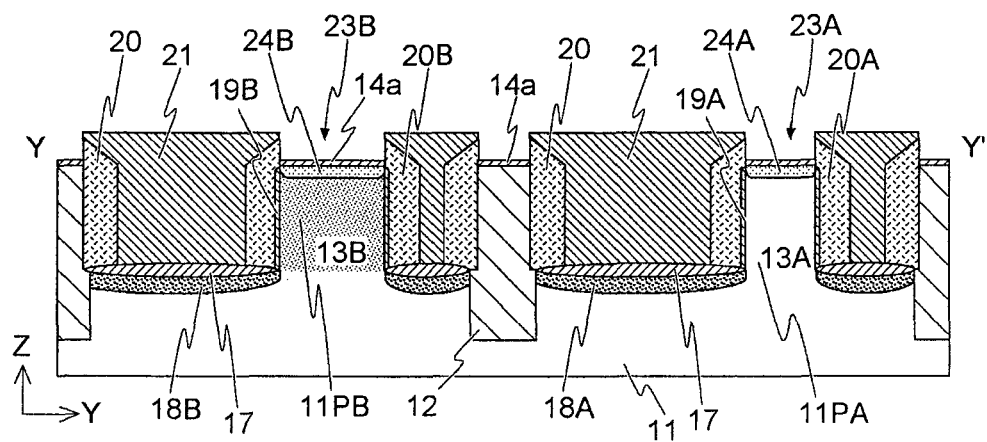
Figure 16A:
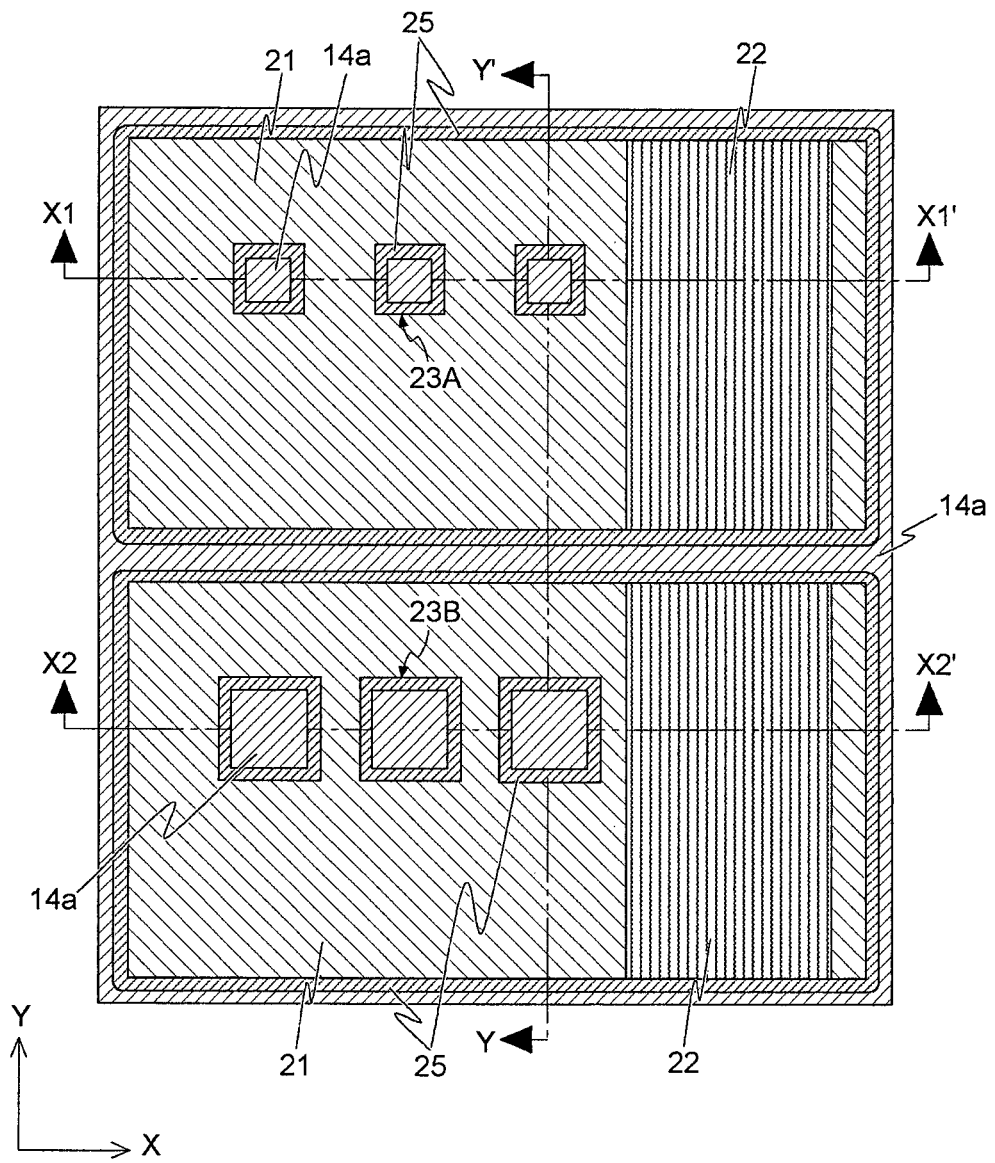
FIG. 16A is a plan view illustrating the manufacturing process of the semiconductor device according to the exemplary embodiment, FIGS. 16B to 16D being a cross-sectional view along line X1-X1', a cross-sectional view along line X2-X2', and a cross-sectional view along line Y-Y respectively in FIG. 16A.
Figure 16B:
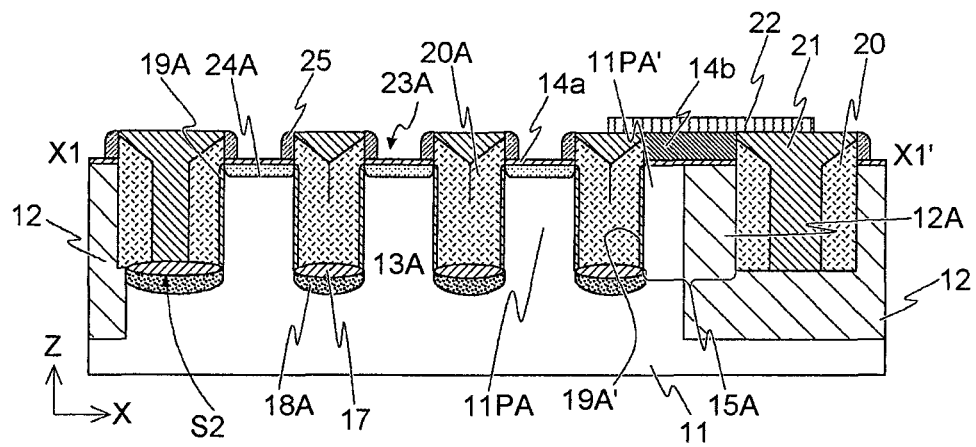
Figure 16C:
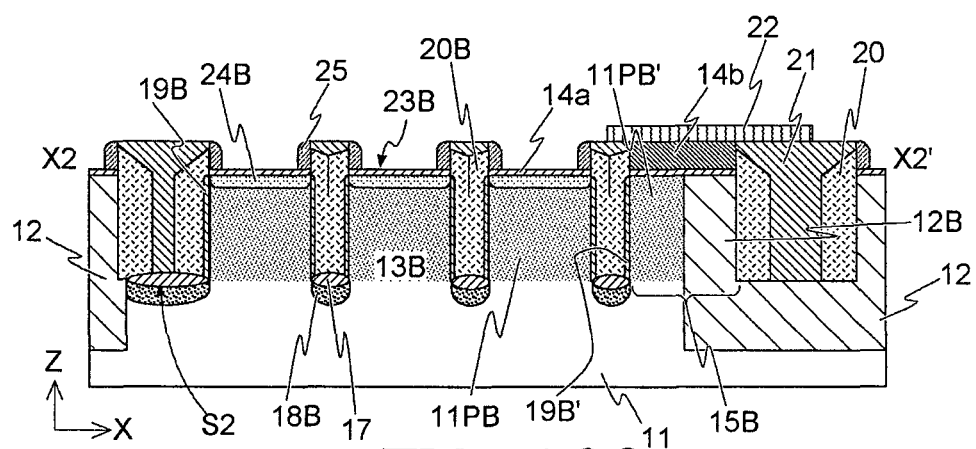
Figure 16D:
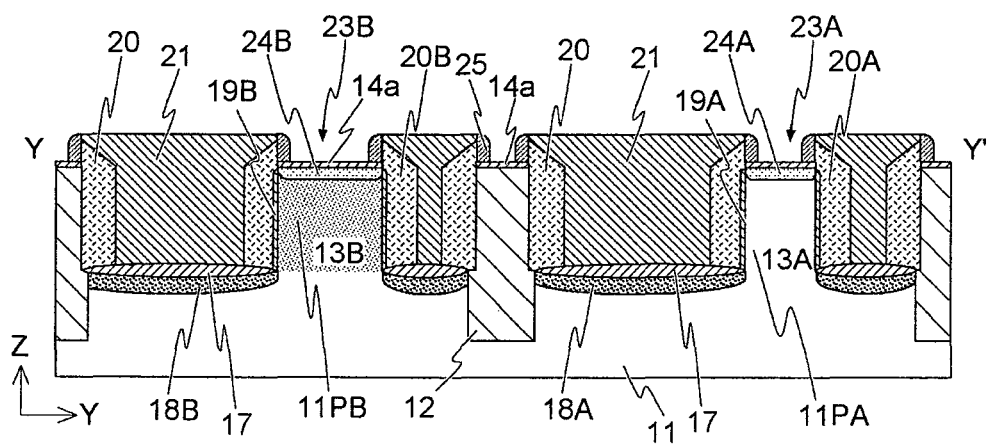
Figure 17A:
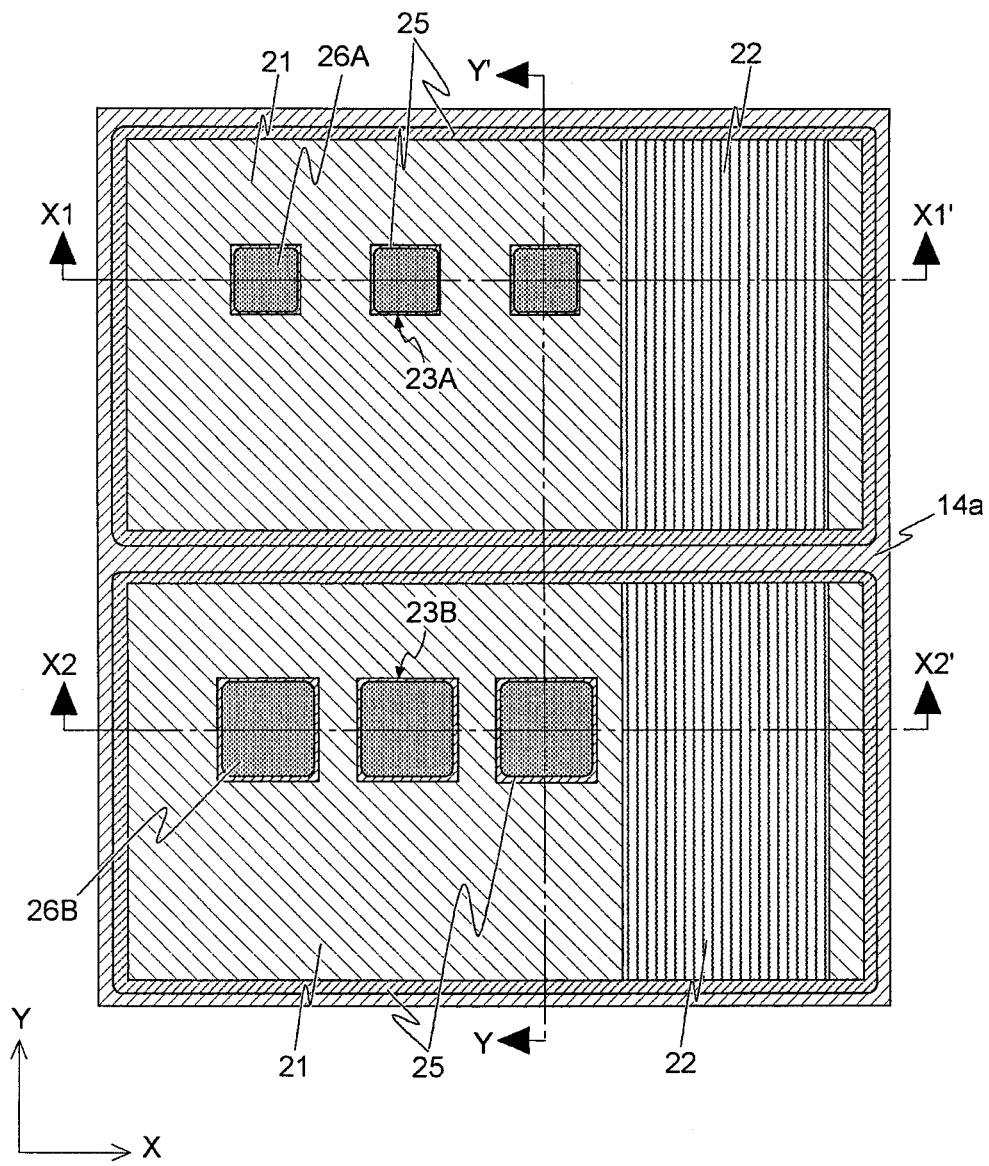
FIG. 17A is a plan view illustrating the manufacturing process of the semiconductor device according to the exemplary embodiment, FIGS. 17B to 17D being a cross-sectional view along line X1-X1', a cross-sectional view along line X2-X2', and a cross-sectional view along line Y-Y respectively in FIG. 17A.
Figure 17B:
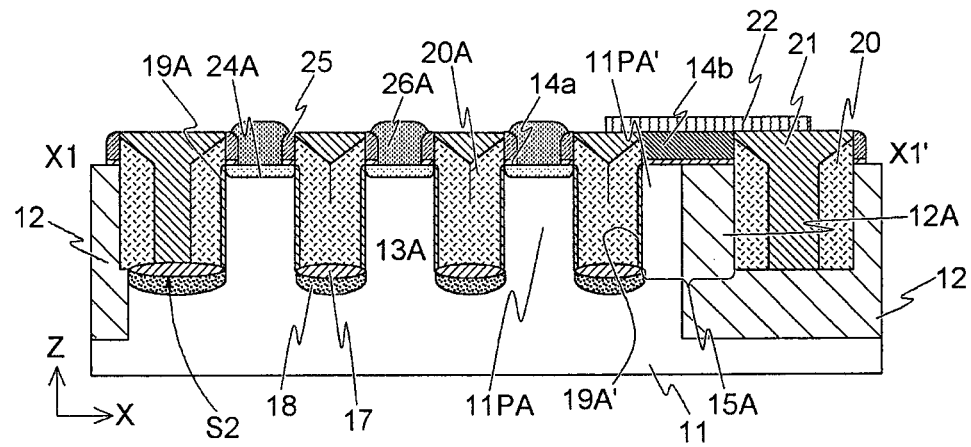
Figure 17C:
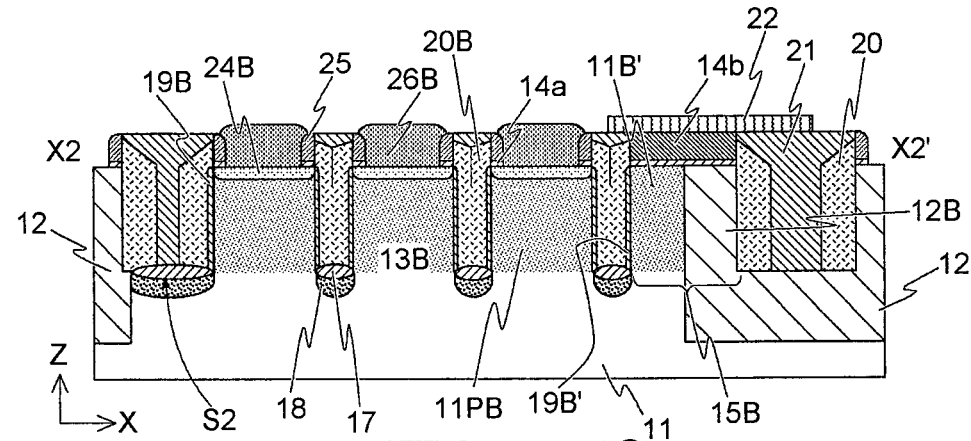
Figure 17D:
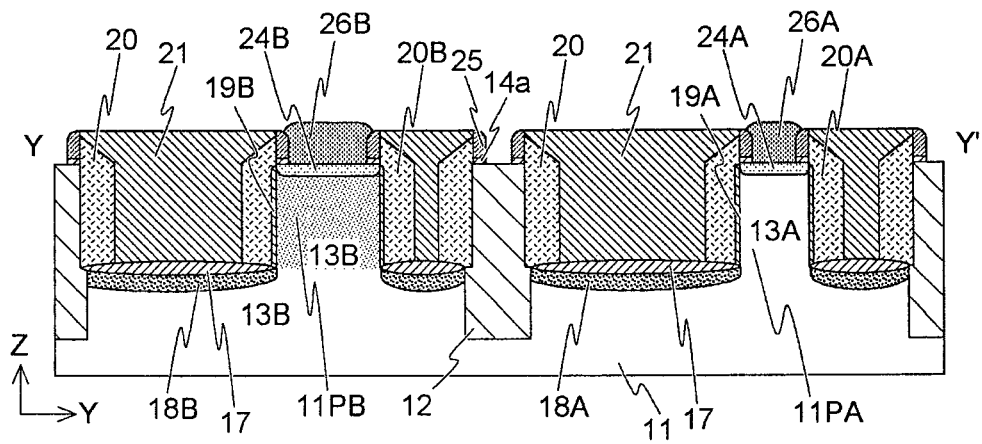
Figure 18A:
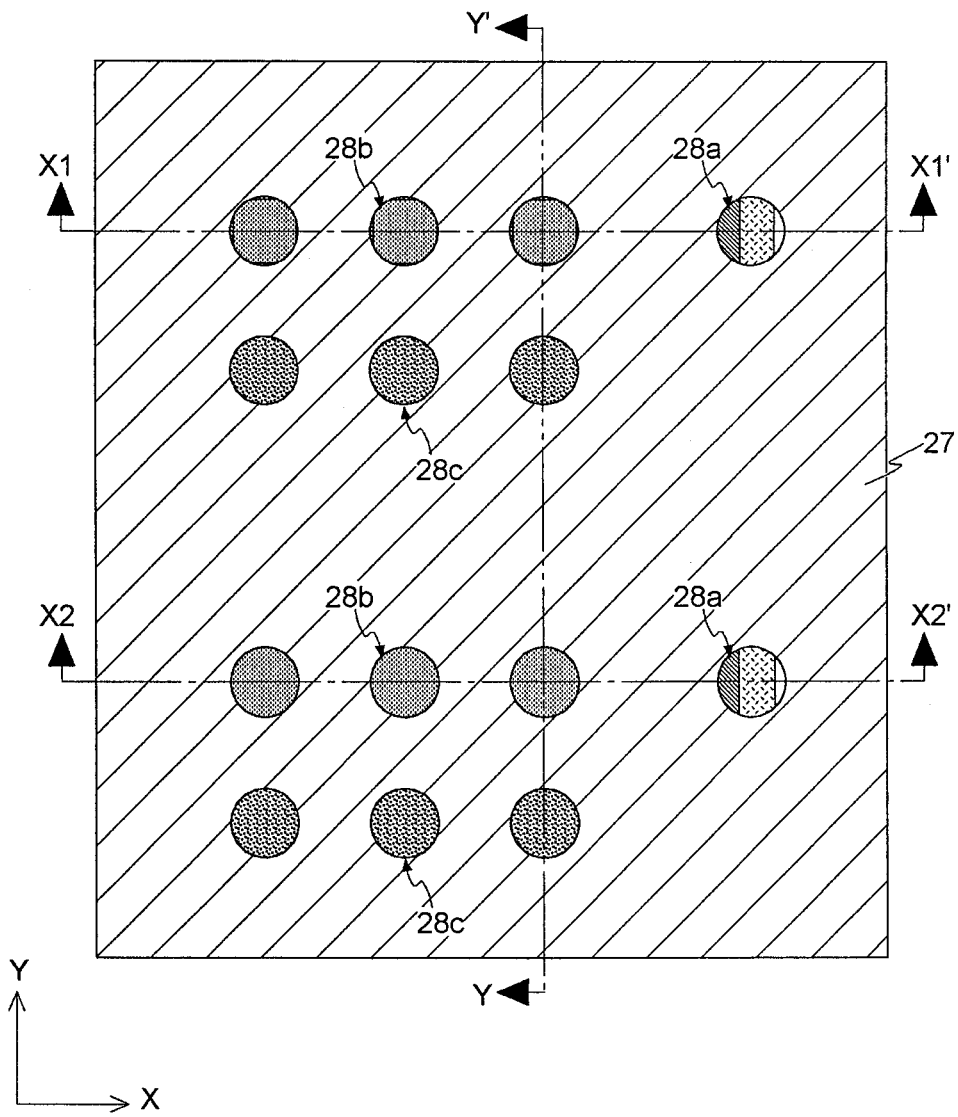
FIG. 18A is a plan view illustrating the manufacturing process of the semiconductor device according to the exemplary embodiment, FIGS. 18B to 18D being a cross-sectional view along line X1-X1', a cross-sectional view along line X2-X2', and a cross-sectional view along line Y-Y respectively in FIG. 18A.
Figure 18B:
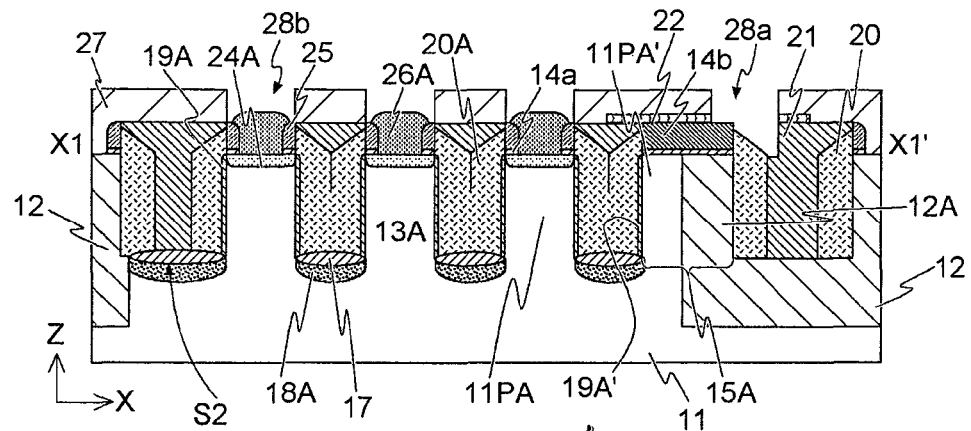
Figure 18C:
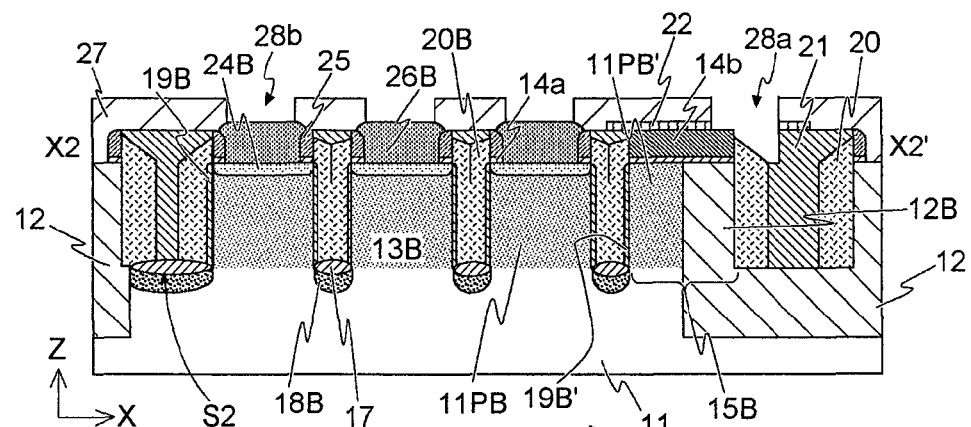
Figure 18D:
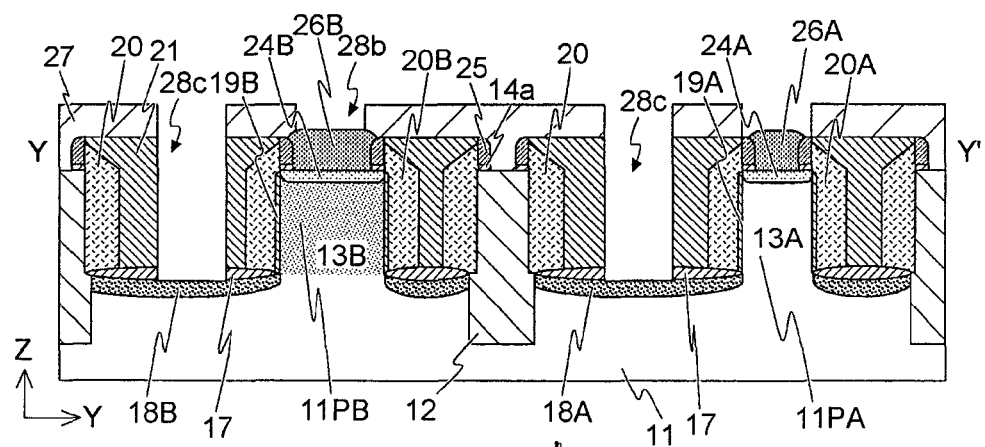
Figure 19A:
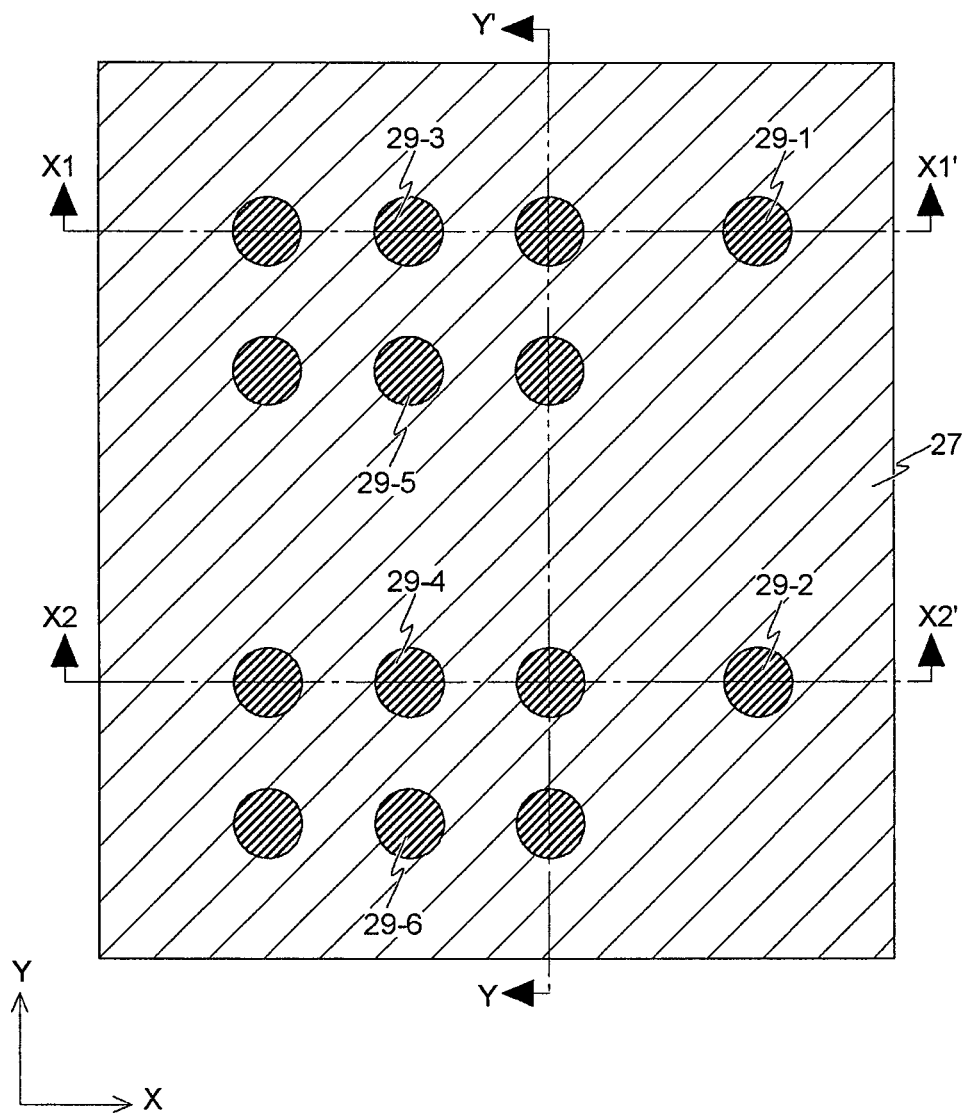
FIG. 19A is a plan view illustrating the manufacturing process of the semiconductor device according to the exemplary embodiment, FIGS. 19B to 19D being a cross-sectional view along line X1-X1', a cross-sectional view along line X2-X2', and a cross-sectional view along line Y-Y respectively in FIG. 19A.
Figure 19B:
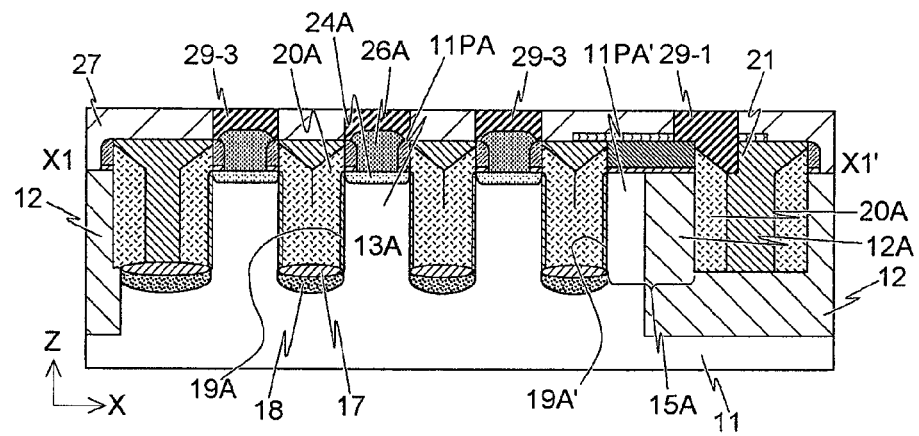
Figure 19C:
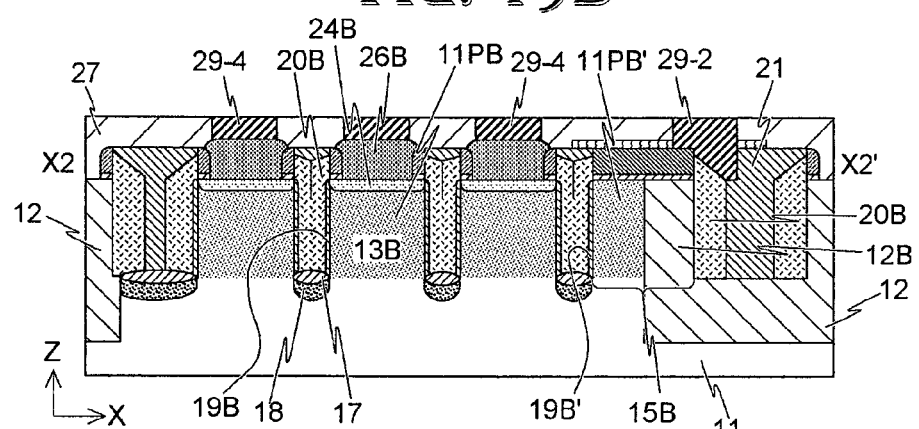
Figure 19D:
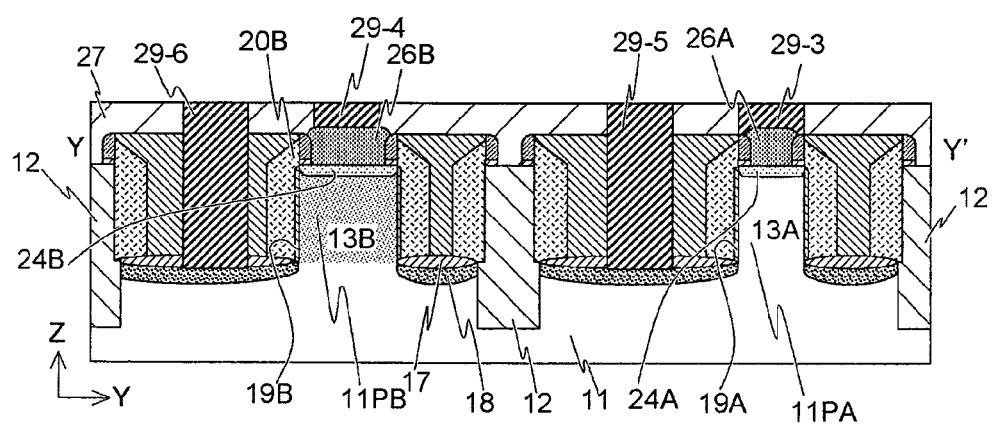

Each of FIG. 3A to FIG. 19D is a process view for describing a method of manufacturing the semiconductor device according to the present exemplary embodiment. Each of sub-FIGs A is a plan view, each of sub-FIGs B to D is a cross-sectional view along line X1-X1', a cross-sectional view along line X2-X2', and a cross-sectional view along line Y-Y' respectively in each of sub-FIGs A. Note that plan views for FIGS. 9B-9D and FIGS. 15B-15D are the same as those for FIG. 8A and FIG. 14A respectively, and thus FIGS. 9A and 15A are omitted, and FIG. 8A and FIG. 14A are used instead. Note that unless there is a need to individually describe, FIGs. nA-nD are collectively written as FIGs. n.

The semiconductor device according to the present exemplary embodiment is manufactured such that first, a silicon substrate is prepared as substrate 11, and then isolation region (shallow trench isolation: STI) 12 including an insulating film is formed on substrate 11 to form active region 13 fenced with STI 12 (FIG. 3). Although a large number of active regions are formed on actual substrate 11, FIG. 3 illustrates only two active regions 13. Although not particularly limited, active region 13 according to the present exemplary embodiment has a rectangular shape.

STI 12 is formed such that a trench having a depth of about 220 nm is formed on a main surface of substrate 11 by dry-etching to form a thin silicon oxide film on an entire surface of the substrate including an inner wall of the trench by thermal oxidation at about 1000° C., and then a silicon oxide film having a thickness of 400 to 500 nm is deposited on the entire surface of the substrate including the interior of the trench by a CVD (Chemical Vapor Deposition) process. Then, an unnecessary silicon oxide film is removed from substrate 11 by a CMP (Chemical Mechanical Polishing) process to leave the silicon oxide film only inside the trench, thereby forming STI 12.

Then, first semiconductor pillar 11PA (hereinafter referred to as first silicon pillar 11PA) and second semiconductor pillar 11PB (hereinafter referred to as second silicon pillar 11PB) are simultaneously formed in respective active regions 13. Each of first and second silicon pillars 11PA and 11PB is a portion serving as a channel of a pillar-FET. Any number of pillar-FETs may be used herein, but the present exemplary embodiment assumes that three pillar-FETs are formed in one active region. Silicon pillars 11PA and 11PB are formed such that first, silicon oxide film 14a serving as a protective insulating film is formed on an entire surface of the substrate to apply resist R thereto, and then subjected to patterning for each active region by lithography, and an impurity such as boron is introduced by ion-implantation so as to have an impurity concentration necessary for each pillar-FET (FIG. 4). Here, an active region having a first impurity concentration is referred to as first active portion 13A, and an active region having a second impurity concentration is referred to as second active portion 13B. In FIG. 4, boron is ion-implanted only into second active portion 13B, but the present exemplary embodiment is not limited to this.

Then, silicon nitride film 14b serving as a hard mask is formed on the entire surface of the substrate. Although not particularly limited, silicon oxide film 14a and silicon nitride film 14b can be formed by a CVD process. For example, silicon oxide film 14a may have a film thickness of about 5 nm, and silicon nitride film 14b may have a film thickness of about 120 nm. In the present exemplary embodiment, a laminated film of silicon oxide film 14a and silicon nitride film 14b may be referred to simply as "hard mask 14". As illustrated in FIG. 5, hard mask 14 is processed such that resist mask R is formed into a predetermined pattern on silicon nitride film 14b by photolithography. Each resist mask R is formed so as to have a different pillar width on first and second active portions 13A and 13B.

Then, a region to form first and second silicon pillars 11PA and 11PB and hard mask 14 in a region outside active region 13 are left intact and the portions other than those regions are removed by patterning hard mask 14. Note that an edge of hard mask 14 covering STI 12 is preferably positioned slightly outside the outer circumference of first and second active portions 13A and 13B so as to prevent an unnecessary silicon pillar from being formed in first and second active portions 13A and 13B.

Further, thus patterned hard mask 14 is used to etch exposed surfaces of first and second active portions 13A and 13B, and STI 12 by dry etching. This etching process causes second surface S2 to be formed on a bottom surface of the exposed surfaces of first and second active portions 13A and 13B. The unetched portions become first and second silicon pillars 11PA and 11PB protruding substantially vertically from second surface S2 (FIG. 6). Thus, substrate 11 is configured to include first surface S1 located on a bottom portion of STI 12; second surface S2 located above first surface S1; and third surface S3 having first edge E1 and second edge E2 connecting first surface S1 and second surface S2 respectively. Hard mask 14 remaining on upper portions of first and second silicon pillars 11PA and 11PB become a cap insulating film. Note that a part of first and second active portions 13A and 13B contacting STI 12 is left as first semiconductor portion 11PA' and second semiconductor portion 11PB' respectively; and the other portions contacting STI 12 become first gate pillar 15A and second gate pillar 15B for gate power supply together with first insulator portion 12A or second insulator portion 12B.

Then, sidewall insulator 16 is formed on side surfaces of first and second silicon pillars 11PA and 11PB as well as first and second gate pillars 15A and 15B (FIG. 7). Sidewall insulator 16 can be formed such that with hard mask 14 left intact, the exposed surface of substrate 11 is protected by thermal oxidation to form a silicon nitride film, and then the silicon nitride film is etched back. As a result, a side wall of STI 12 and side surfaces of first and second silicon pillars 11PA and 11PB as well as first and second gate pillars 15A and 15B are covered with sidewall insulator 16.

Then, second surface S2 of substrate 11 is thermally oxidized to form bottom silicon oxide film 17 (FIG. 8). At this time, upper surfaces and side surfaces of first and second silicon pillars 11PA and 11PB as well as first and second semiconductor portions 11PA' and 11PB' are covered with hard mask 14 as a cap insulating film and sidewall insulator 16 respectively and thus are not thermally oxidized. Although not particularly limited, bottom silicon oxide film 17 may have a film thickness of about 30 nm. Note that the surface of substrate 11 on which bottom silicon oxide film 17 is formed is still referred to as second surface S2.

Then, lower diffusion layer 18 is formed in a lower portion of first and second silicon pillars 11PA and 11PB (FIG. 9). Lower diffusion layer 18 can be formed on an upper portion of second surface S2 by ion-implanting an impurity having a conductivity type opposite to that of the impurity in substrate 11 (channel) through bottom silicon oxide film 17 formed on second surface S2. Here, boron as a P-type impurity is implanted into the channel beforehand, and thus phosphorus or arsenic as an N-type impurity opposite to this is ion-implanted. Lower diffusion layer 18 formed on first active portion 13A is referred to as first lower diffusion portion 18A. Lower diffusion layer 18 formed on second active portion 13B is referred to as second lower diffusion portion 18B. Lower diffusion layer 18 becomes a source region of a pillar-FET to be formed. First and second lower diffusion portions 18A and 18B become first and second source regions, respectively.

Then, sidewall insulator 16 is removed by wet etching; and with hard mask 14 left intact, first and second gate insulators 19A and 19B are simultaneously formed on side surfaces of first and second silicon pillars 11PA and 11PB, respectively (FIG. 10). First and second gate insulators 19A and 19B can be formed by thermal oxidation and may have substantially the same film thickness of about 5 nm. At this time, first and second dummy gate insulators 19A' and 19B' are also formed on surfaces of first and second semiconductor portions 11PA' and 11PB'.

Then, polysilicon film 20 serving as a gate electrode is formed (FIG. 11). With hard mask 14 left intact, polysilicon film 20 with a film thickness of about 30 nm is conformally formed on an entire surface of the substrate by a CVD process and then polysilicon film 20 is etched back to a position lower than the upper surface of hard mask 14. Note that the silicon pillar interval is set to less than twice the film thickness of polysilicon film 20. Thereby, first gate electrode 20A continuing on side surfaces of three first silicon pillars 11PA is formed in first active portion 13A. First gate electrode 20A is further formed continuing on side surfaces of first gate pillar 15A. Likewise, second gate electrode 20B continuing on side surfaces of three second silicon pillars 11PB and second gate pillar 15B is formed in second active portion 13B. Note that polysilicon film 20 is also left intact on side surfaces of STI 12, but this polysilicon film 20 does not function as a gate electrode.

Then, interlayer insulating film 21 made of a silicon oxide film is formed on the entire surface and then the surface of interlayer insulating film 21 is polished and planarized by a CMP process (FIG. 12). At this time, silicon nitride film 14b plays a role of a CMP stopper and thus can reliably control the film thickness of interlayer insulating film 21. Thus, the inside of first and second active portions 13A and 13B is filled with interlayer insulating film 21.

Then, mask oxide film 22 for protecting hard mask 14 of an upper portion of first and second gate pillars 15A and 15B is formed (FIG. 13). First, a silicon oxide film with a film thickness of about 5 nm is formed on the entire surface by a CVD process. Then, mask oxide film 22 is patterned so as to expose silicon nitride film 14b formed above first and second silicon pillars 11PA and 11PB and protect silicon nitride film 14b above first and second gate pillars 15A and 15B.

Then, exposed silicon nitride film 14b is removed by dry etching or wet etching to thereby form first and second through holes 23A and 23B using silicon oxide film 14a as a protective insulating film on the bottom surface thereof above first and second silicon pillars 11PA and 11PB (FIG. 14). First and second through holes 23A and 23B are formed by removing silicon nitride film 14b used as a mask when first and second silicon pillars 11PA and 11PB are formed. Thus, first and second through holes 23A and 23B are formed in a self-aligned manner with respect to first and second silicon pillars 11PA and 11PB. Thus, in plan view, the wall surfaces of first and second through holes 23A and 23B match the outer peripheral portions of first and second silicon pillars 11PA and 11PB respectively. Note that silicon nitride film 14b on the outer peripheral portions and on STI 12 between first and second active portions 13A and 13B is also removed.

Then, first and second LDD regions 24A and 24B are formed in upper portions of first and second silicon pillars 11PA and 11PB, respectively (FIG. 15). First and second LDD regions 24A and 24B can be formed by shallowly ion-implanting an impurity having a conductivity type opposite to that of the impurity in the channel at a low concentration from first and second through holes 23A and 23B formed on upper portions of first and second silicon pillars 11PA and 11PB respectively through silicon oxide film 14a. Silicon nitride film 14b remains on upper portions of first and second semiconductor portions 11PA' and 11PB' and no LDD region is formed.

Then, sidewall insulator 25 is formed on inner wall surfaces of first and second through holes 23A and 23B (FIG. 16). Sidewall insulator 25 can be formed in such a manner that a silicon nitride film is formed on an entire surface of the substrate and then is etched back. Although not particularly limited, the silicon nitride film may have a film thickness of about 10 nm. Thus, sidewall insulator 25 is formed on inner wall surfaces of first and second through holes 23A and 23B.

Then, first and second upper diffusion layers 26A and 26B are formed on upper portions of first and second silicon pillars 11PA and 11PB respectively. First and second upper diffusion layers 26A and 26B are formed in such a manner that first, silicon oxide film 14a exposed on bottom surfaces of first and second through holes 23A and 23B are removed to expose upper surfaces of first and second silicon pillars 11PA and 11PB. Then, the silicon epitaxial layer is formed from upper surfaces of first and second silicon pillars 11PA and 11PB by a selective epitaxial growth process. Thus, a substantially single crystal silicon grows. Then, first and second upper diffusion layers 26A and 26B are formed by ion-implanting an impurity having a conductivity type opposite to that of the impurity in the silicon substrate at a higher concentration than for first and second LDD regions 24A and 24B into the silicon epitaxial layer (FIG. 17).

Then, interlayer insulating film 27 is formed on the entire surface of the substrate and then first, second, and third contact holes 28a, 28b, and 28c are formed by patterning (FIG. 18). First contact holes 28a become a gate contact passing through interlayer insulating film 27, mask oxide film 22, and interlayer insulating film 21 and reaching first and second gate electrodes 20A and 20B formed around first and second gate pillars 15A and 15B. Second contact holes 28b are formed immediately above first and second silicon pillars 11PA and 11PB and become a drain contact passing through interlayer insulating film 27 and reaching first and second upper diffusion layers 26A and 26B. Third contact holes 28c are formed in a free space inside first and second active portions 13A and 13B adjacent to first and second silicon pillars 11PA and 11PB and become a source contact passing through interlayer insulating films 27 and 21, and bottom silicon oxide film 17, and reaching lower diffusion layers 18 (first and second lower diffusion portions 18A and 18B). In particular, first contact holes 28a are formed on a side of STI 12 facing first and second silicon pillars 11PA and 11PB through first and second gate pillars 15A and 15B and thus can secure a sufficient margin to second contact holes 28b.

Then, polysilicon is buried into contact holes 28a, 28b, and 28c to form a contact plug (FIG. 19). First and second contact plugs 29-1 and 29-2 formed inside first contact holes 28a are connected to first and second gate electrodes 20A and 20B, respectively. Third and fourth contact plugs 29-3 and 29-4 formed inside second contact holes 28b are connected to first and second upper diffusion regions 26A and 26B, respectively. Fifth and sixth contact plugs 29-5 and 29-6 formed inside third contact holes 28c are connected to first and second lower diffusion portions 18A and 18B, respectively.

Finally, semiconductor device 100 according to the present exemplary embodiment is completed by forming first to fifth conductive layers 30-1 to 30-5 (30-5-1 and 30-5-2) so as to connect to first to sixth contact plugs 29-1 to 29-6 on upper portions (FIG. 1).

Exemplary Embodiment 2

Figure 20A:
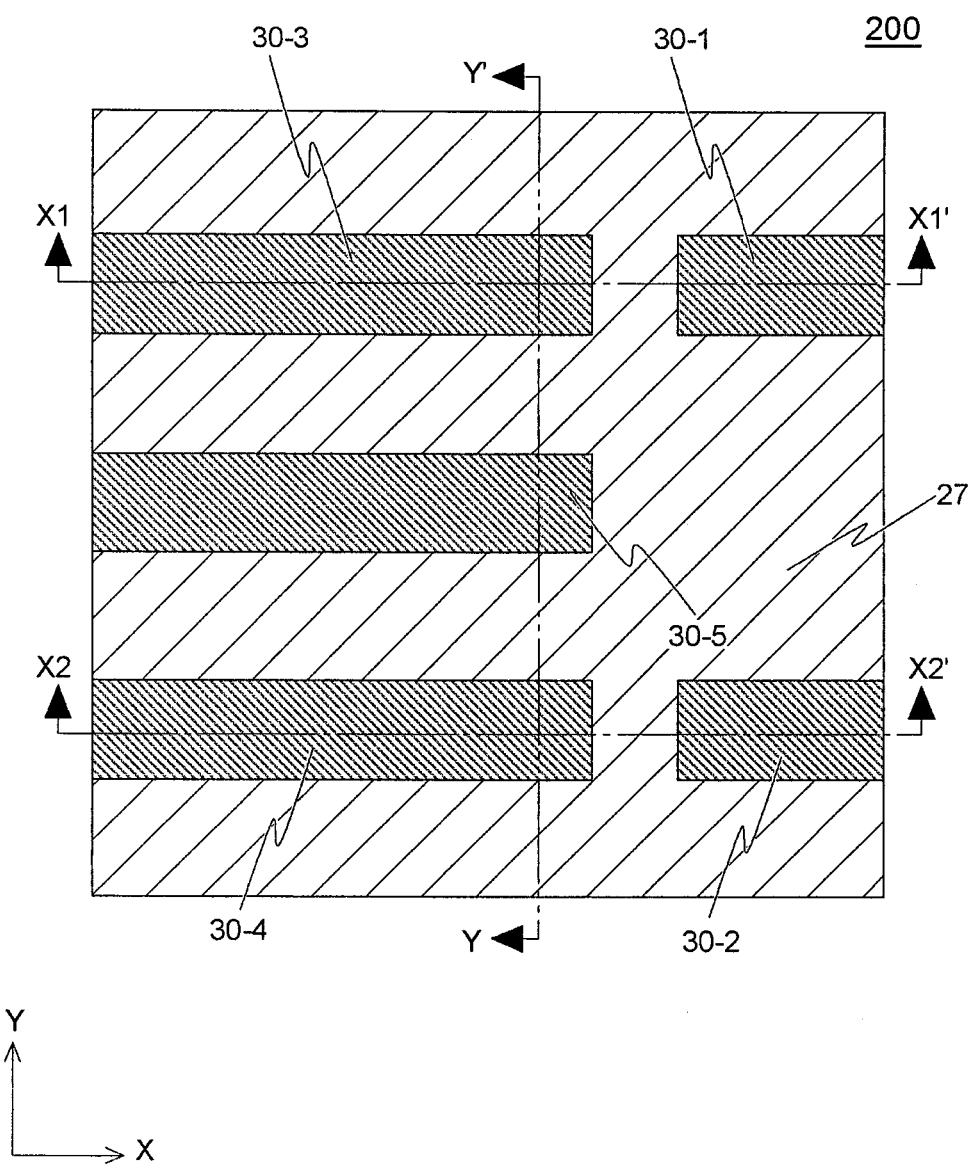
FIG. 20A is a plan view of main components of a semiconductor device according to another exemplary embodiment, FIGS. 20B to 20D being a cross-sectional view along line X1-X1', a cross-sectional view along line X2-X2', and a cross-sectional view along line Y-Y' respectively in FIG. 20A.

Now, as another exemplary embodiment, an example of forming two types of pillar-FETs 32A' and 32B' having a different threshold voltage in one active region 13 will be described. FIG. 20A is a plan view of main components of a semiconductor device 200 according to another exemplary embodiment, FIGS. 20B to 20D being a cross-sectional view along line X1-X1', a cross-sectional view along line X2-X2', and a cross-sectional view along line Y-Y respectively in FIG. 20A.

As illustrated in FIG. 2, Vtc of pillar width A (a6) and Vte of pillar width B (b6) have the same impurity concentration (C6), and thus first and second pillar-FETs 32A' and 32B' having two types of threshold voltages including first and second channel regions 31A' and 31B' having the same impurity concentration can be formed on one active region 13.

Figure 20B:
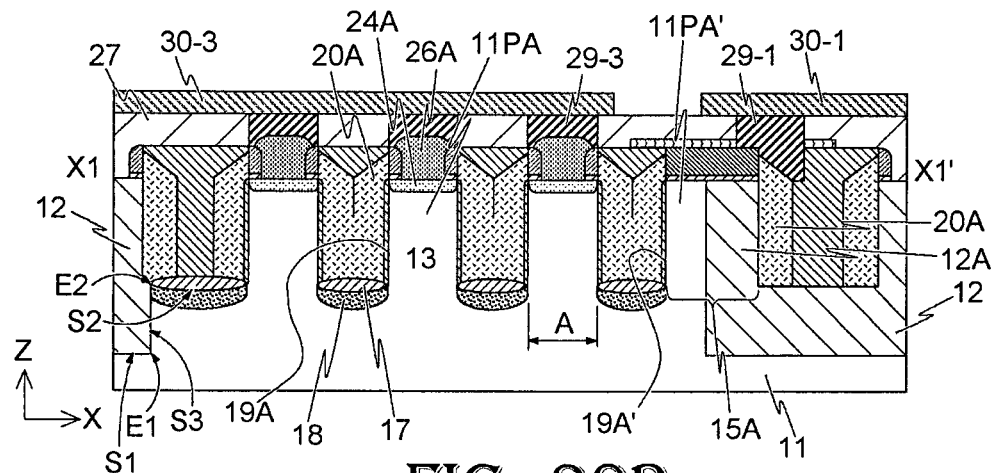
Figure 20C:
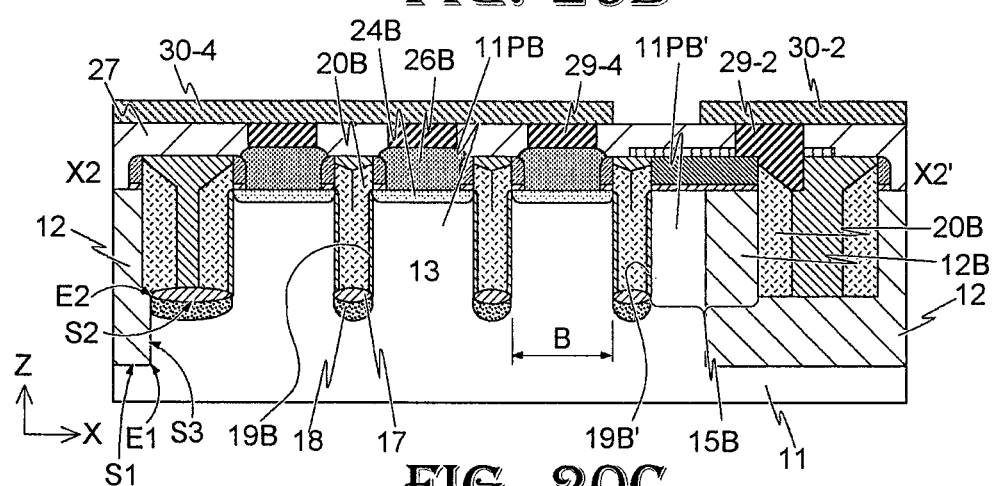
Figure 20D:
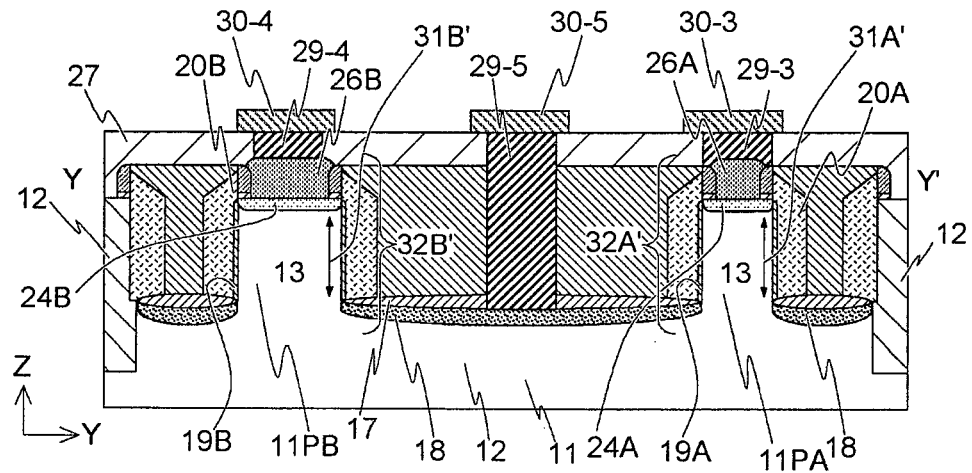

The sectional structure of FIGS. 20B and 20C is the same as that of FIGS. 1B and 10 except that first silicon pillar 11PA and second silicon pillar 11PB are formed on the same active region 13 and lower diffusion layer 18 is shared. In FIG. 20A, fifth conductive layer 30-5 is not branched into first and second wiring portions 30-5-1 and 30-5-2, but is illustrated as one fifth conductive layer 30-5. As illustrated in FIG. 20D, STI 12 separating between first silicon pillar 11PA and second silicon pillar 11PB is eliminated and instead lower diffusion layer 18 common to the portions extends to be connected to fifth conductive layer 30-5 through fifth contact plug 29-5.

Such a semiconductor device can be manufactured in the same manner as semiconductor device 100 illustrated in FIG. 1 except that there is no need to separately ion-implant an impurity into the active region illustrated in FIG. 4.

So far, exemplary embodiments have been described, but the present invention is not limited to the aforementioned exemplary embodiments, and various modifications can be made without departing from the spirit and scope of the invention. These modifications should be apparently included in the scope of the present invention.

For example, in the aforementioned exemplary embodiments, first and second gate pillars 15A and 15B are provided adjacent to first and second silicon pillars 11PA and 11PB serving as a channel of a pillar transistor, but the present invention does not require providing such gate pillars.

In addition, in the aforementioned exemplary embodiments, both first and second silicon pillars 11PA and 11PB are of square shape and have a analogue planar shape, but the present invention is not limited to such shapes, but may have various shapes. For example, the silicon pillar may have not only a rectangular shape elongated in the direction of the plane but also a circular, elliptical, polygonal planar shape.

In addition, in the aforementioned exemplary embodiments, a silicon epitaxial layer is formed in a through-hole and ions are implanted into the silicon epitaxial layer to form first and second upper diffusion regions 26A and 26B, but the present invention is not limited to this process. For example, first and second upper diffusion regions 26A and 26B (can be shared with a contact plug) may be formed by burying an impurity-doped polysilicon film into the through-hole. Note that the use of a selective epitaxial growth process can secure the continuity of the crystal, and thus can obtain more excellent transistor characteristics. In addition, in the aforementioned exemplary embodiments, first and second silicon pillars 11PA and 11PB and first and second upper diffusion regions 26A and 26B are separately formed, but first and second upper diffusion regions 26A and 26B may be formed by ion-implantation into upper portions of first and second silicon pillars 11PA and 11PB.

What is claimed is:
1. A semiconductor device comprising:
a semiconductor substrate including first, second and third surfaces, the second surface being placed above the first surface, the third surface having first and second edges connecting to the first and second surfaces, respectively;
an isolation region including an insulator and formed on the first and third surfaces;
an active region including the second surface and fenced with the insulator of the isolation region; and
first and second semiconductor pillars each protruding upwardly from the second surface in the active region,
wherein the first semiconductor pillar is thinner than the second semiconductor pillar.

2. The semiconductor device according to claim 1, wherein the first semiconductor pillar has a first pillar width that is equal to or less than 100 nm,
the second semiconductor pillar has a second pillar width that is bigger than the first pillar width by 10 nm or more.

3. The semiconductor device according to claim 1, further comprising:
first and second upper diffusion layers each disposed in respective upper portions of the first and second semiconductor pillars; and
a lower diffusion layer disposed on the second surface of the semiconductor substrate.

4. The semiconductor device according to claim 3, further comprising:
first and second channel regions each disposed between a corresponding one of the first and second upper diffusion layers and the lower diffusion layer;
a first gate insulator disposed on the first semiconductor pillar and surrounding the first channel region;
a first gate electrode surrounding the first channel region through the first gate insulator;
a second gate insulator disposed on the second semiconductor pillar and surrounding the second channel region; and
a second gate electrode surrounding the second channel region through the second gate insulator.

5. The semiconductor device according to claim 4, wherein the first channel region has an impurity concentration that is substantially the same as that of the second channel region.

6. The semiconductor device according to claim 5, wherein the first gate insulator has the same thickness as the second gate insulator.

7. The semiconductor device according to claim 4, further comprising:
first and second conductive layers electrically connecting to the first and second gate electrodes, respectively;
third and fourth conductive layers each electrically connecting to a corresponding one of the first and second upper diffusion layers; and
a fifth conductive layer electrically connecting to the lower diffusion layer.

8. The semiconductor device according to claim 7, further comprising:
a first gate pillar including a first semiconductor portion that protrudes upwardly from the second surface and including a first insulator portion that is disposed in the insulator at the isolation region,
wherein the first semiconductor portion is combined with the first insulator portion in a boundary of the isolation region and the active region; and
a second gate pillar including a second semiconductor portion that protrudes upwardly from the second surface and including a second insulator portion that is disposed in the insulator at the isolation region,
wherein the second semiconductor portion is combined with the second insulator portion in a boundary of the isolation region and the active region.

9. The semiconductor device according to claim 8, wherein
the first gate electrode surrounds continuously both of the first semiconductor pillar and the first gate pillar,
the second gate electrode surrounds continuously both of the second semiconductor pillar and the second gate pillar.

10. The semiconductor device according to claim 9,
wherein the first conductive layer comes in contact with the first gate electrode that surrounds the first gate pillar in the isolation region,
wherein the second conductive layer comes in contact with the second gate electrode that surrounds the second gate pillar in the isolation region.

11. The semiconductor device according to claim 10,
wherein both the first and second gate electrodes are placed over the first surface through the insulator in the isolation region.

12. The semiconductor device according to claim 7, further comprising:
first and second active portions provided in the active region and divided each other by the isolation region;
first and second lower diffusion portions in the lower diffusion layer placed in the first and second active portions, respectively; and
first and second wiring portions of the fifth conductive layer connecting electrically to the first and second active portions.

13. A semiconductor device comprising:
a semiconductor substrate including first, second and third surfaces, the second surface being placed above the first surface, the third surface having first and second edges that connects to the first and second surfaces, respectively;
an isolation region including an insulator and formed on the first and third surfaces;
an active region including the second surface and fenced with the insulator of the isolation region;
a plurality of first semiconductor pillars each protruding upwardly from the second surface in the active region;
a plurality of second semiconductor pillars each protruding upwardly from the second surface in the active region,
wherein each of the first semiconductor pillars is thinner than each of the second semiconductor pillars.

14. The semiconductor device according to claim 13, further comprising:
a plurality of first upper diffusion layers disposed in upper portion of the plurality of the first semiconductor pillars, respectively;
a plurality of second upper diffusion layers disposed in upper portions of the plurality of the second semiconductor pillars, respectively; and
a lower diffusion layer disposed on the second surface of the semiconductor substrate.

15. The semiconductor device according to claim 14, further comprising:
a plurality of first channel regions each disposed between the lower diffusion layer and a corresponding one of the first upper diffusion layers;
a plurality of second channel regions each disposed between the lower diffusion layer and a corresponding one of the second upper diffusion layers;
a plurality of first gate insulators each disposed on a corresponding one of the first semiconductor pillars and surrounding a corresponding one of the first channel regions;
a first gate electrode surrounding continuously the plurality of the first channel regions through the first gate insulators;
a plurality of second gate insulators each disposed on a corresponding one of the second semiconductor pillars and surrounding a corresponding one of the second channel regions; and
a second gate electrode surrounding continuously the plurality of the second channel regions through the second gate insulators.

16. The semiconductor device according to claim 15, further comprising:
first and second conductive layers each electrically connecting to the first and second gate electrodes, respectively;
a third conductive layer electrically connecting to the plurality of the first upper diffusion layers; and
a fourth conductive layer electrically connecting to the plurality of the second upper diffusion layers; and
a fifth conductive layer electrically connecting to the lower diffusion layer.

17. A semiconductor device comprising:
a semiconductor substrate including first, second and third surfaces, the second surface being placed above the first surface, the third surface having first and second edges connecting to the first and second surfaces, respectively;
an isolation region including an insulator and formed on the first and third surfaces;
an active region including the second surface and fenced with the insulator of the isolation region; and
a first field effect transistor including a plurality of first semiconductor pillars that protrude upwardly from the second surface in the active region; and
a second field effect transistor including a plurality of second semiconductor pillars that protrude upwardly from the second surface in the active region;
wherein each of the first semiconductor pillars is thinner than each of the second semiconductor pillars.

18. The semiconductor device according to claim 17, the first field effect transistor further comprising:
a first gate pillar including a first semiconductor portion that protrudes upwardly from the second surface and including a first insulator portion that is disposed in the insulator at the isolation region;
a plurality of first drain regions disposed in each upper portion of the plurality of the first semiconductor pillars;
a first source region disposed on the second surface;
a plurality of first channel regions each disposed between the first source region and a respective one of the first drain regions; and
a first gate electrode surrounding continuously the plurality of the first channel regions and a part of the gate pillar.

19. The semiconductor device according to claim 18, the second field effect transistor further comprising:
a second gate pillar including a second semiconductor portion that protrudes upwardly from the second surface and including a second insulator portion that is disposed in the insulator at the isolation region;
a plurality of second drain regions disposed in each upper portion of the plurality of the second semiconductor pillars;
a second source region disposed on the second surface;
a plurality of second channel regions each disposed between the second source region and a respective one of the second drain regions; and a second gate electrode surrounding continuously the plurality of the second channel regions and a part of the gate pillar.

20. The semiconductor device according to claim 19, further comprising:
first and second conductive layers electrically connecting to the first and second gate electrodes, respectively;
a third conductive layer electrically connecting to the plurality of the first drain regions;
a fourth conductive layer electrically connecting to the plurality of the second drain regions; and
a fifth conductive layer electrically connecting to the source region.

* * * * *